United States Patent
Metz et al.

(10) Patent No.: US 9,853,107 B2
(45) Date of Patent: Dec. 26, 2017

(54) SELECTIVE EPITAXIALLY GROWN III-V MATERIALS BASED DEVICES

(71) Applicant: Intel Corporation, Santa Clara, CA (US)

(72) Inventors: Matthew V. Metz, Portland, OR (US); Jack T. Kavalieros, Portland, OR (US); Gilbert Dewey, Beaverton, OR (US); Willy Rachmady, Beaverton, OR (US); Benjamin Chu-Kung, Hillsboro, OR (US); Marko Radosavljevic, Portland, OR (US); Han Wui Then, Portland, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/120,803

(22) PCT Filed: Mar. 28, 2014

(86) PCT No.: PCT/US2014/032149
§ 371 (c)(1),
(2) Date: Aug. 23, 2016

(87) PCT Pub. No.: WO2015/147858
PCT Pub. Date: Oct. 1, 2015

(65) Prior Publication Data
US 2016/0365416 A1 Dec. 15, 2016

(51) Int. Cl.
*H01L 29/205* (2006.01)
*H01L 21/82* (2006.01)
(Continued)

(52) U.S. Cl.
CPC ...... *H01L 29/205* (2013.01); *H01L 21/02381* (2013.01); *H01L 21/02461* (2013.01);
(Continued)

(58) Field of Classification Search
CPC .................. H01L 29/205; H01L 29/785; H01L 21/823431
See application file for complete search history.

(56) References Cited

U.S. PATENT DOCUMENTS 6,372,356 B1 * 4/2002 Thornton ................ B32B 15/01
257/189
8,617,945 B2 12/2013 Hudait et al.
(Continued)

FOREIGN PATENT DOCUMENTS

JP 06244217 9/1994
JP 2003289152 10/2003
(Continued)

OTHER PUBLICATIONS

International Searching Authority, "Notification of Transmittal of the International Search Report and the Written Opinion of the International Searching Authority," dated Dec. 29, 2015 in International application No. PCT/US2013/048743.
(Continued)

*Primary Examiner* — Evan Pert
(74) *Attorney, Agent, or Firm* — Trop, Pruner & Hu, P.C.

(57) ABSTRACT

An embodiment includes a III-V material based device, comprising: a first III-V material based buffer layer on a silicon substrate; a second III-V material based buffer layer on the first III-V material based buffer layer, the second III-V material including aluminum; and a III-V material based device channel layer on the second III-V material based buffer layer. Another embodiment includes the above subject matter and the first and second III-V material based buffer
(Continued)

layers each have a lattice parameter equal to the III-V material based device channel layer. Other embodiments are included herein.

23 Claims, 12 Drawing Sheets

(51) Int. Cl.
- H01L 29/78 (2006.01)
- H01L 21/8234 (2006.01)
- H01L 21/02 (2006.01)
- H01L 29/66 (2006.01)

(52) U.S. Cl.
CPC .. *H01L 21/02463* (2013.01); *H01L 21/02466* (2013.01); *H01L 21/02502* (2013.01); *H01L 21/02546* (2013.01); *H01L 21/02549* (2013.01); *H01L 21/02639* (2013.01); *H01L 21/823431* (2013.01); *H01L 29/66522* (2013.01); *H01L 29/78* (2013.01); *H01L 29/785* (2013.01)

(56) References Cited

U.S. PATENT DOCUMENTS

| | | | | |
|---|---|---|---|---|
| 8,866,195 | B2 * | 10/2014 | Oxland | H01L 29/45 257/200 |
| 9,640,622 | B2 * | 5/2017 | Goel | H01L 29/205 |
| 9,711,591 | B2 * | 7/2017 | Mukherjee | H01L 29/06 |
| 2001/0008299 | A1 | 7/2001 | Linthicum et al. | |
| 2001/0042503 | A1 | 11/2001 | Lo et al. | |
| 2003/0183896 | A1 | 10/2003 | Nagata et al. | |
| 2005/0242395 | A1 | 11/2005 | Chen et al. | |
| 2007/0215905 | A1 | 9/2007 | Kohiro et al. | |
| 2008/0237606 | A1 | 10/2008 | Kikkawa et al. | |
| 2009/0267196 | A1 | 10/2009 | Dyer et al. | |
| 2009/0315018 | A1 * | 12/2009 | Hudait | B82Y 10/00 257/24 |
| 2010/0025683 | A1 | 2/2010 | Cheng | |
| 2010/0032791 | A1 | 2/2010 | Hozumi et al. | |
| 2010/0263707 | A1 | 10/2010 | Cheong et al. | |
| 2010/0327261 | A1 | 12/2010 | Hudait et al. | |
| 2011/0013657 | A1 | 1/2011 | Sumitomo et al. | |
| 2011/0101421 | A1 | 5/2011 | Xu | |
| 2011/0147711 | A1 | 6/2011 | Pillarisetty et al. | |
| 2012/0292665 | A1 | 11/2012 | Marino et al. | |
| 2013/0270607 | A1 | 10/2013 | Doornbos et al. | |
| 2014/0001439 | A1 * | 1/2014 | Chen | B82Y 10/00 257/22 |
| 2014/0001519 | A1 | 1/2014 | Dewey et al. | |
| 2014/0008699 | A1 * | 1/2014 | Oxland | H01L 29/45 257/192 |
| 2016/0203980 | A1 * | 7/2016 | Basu | H01L 29/205 438/478 |
| 2016/0204208 | A1 * | 7/2016 | Goel | H01L 29/66795 257/190 |
| 2017/0104012 | A1 * | 4/2017 | Cheng | H01L 27/1211 |
| 2017/0125445 | A1 * | 5/2017 | Cheng | H01L 27/1211 |
| 2017/0194142 | A1 * | 7/2017 | Goel | H01L 21/02549 |

FOREIGN PATENT DOCUMENTS

| | | |
|---|---|---|
| JP | 2010040973 | 8/2010 |
| JP | 5292716 | 9/2013 |
| KR | 1020070032721 | 3/2007 |
| TW | 381426 | 1/2013 |
| WO | 2014209390 | 12/2014 |

OTHER PUBLICATIONS

Taiwan Intellectual Property Office, Office Action dated Mar. 16, 2016 in Taiwanese Patent Application No. 104106028.
Taiwan Intellectual Property Office, Notice of Allowance dated Mar. 24, 2016 in Taiwanese Patent Application No. 103121216. (With English Translation of Claims only).
International Searching Authority, "Notification of Transmittal of the International Search Report and the Written Opinion of the International Searching Authority," dated Dec. 24, 2014, in International application No. PCT/2014/032149.
Korea Intellectual Property Office, Office Action dated Nov. 29, 2016 in Korean Patent Application No. 104106028.
European Patent Office, "Extended European Search Report", dated Sep. 28, 2017 in European Application No. 14886790.6.

* cited by examiner

US 9,853,107 B2

SELECTIVE EPITAXIALLY GROWN III-V MATERIALS BASED DEVICES

TECHNICAL FIELD

Embodiments as described herein relate to the field of electronic device manufacturing, and in particular, to manufacturing of III-V materials based devices.

BACKGROUND ART

A selective area epitaxy may be used to form III-V MOS devices on a silicon (Si) substrate. Generally, selective area epitaxy refers to the local growth of an epitaxial layer through a patterned dielectric mask that is deposited on a semiconductor substrate. However, defects are generated when the III-V materials are grown on the Si substrate. The defects are due to lattice mismatch between the III-V materials and the Si, as well as the non-polar to polar transition moving from the Si material to the III-V materials. These defects can reduce the mobility of carriers (e.g., electrons, holes, or both) in the III-V materials. Due to the defects, integration of III-V materials based devices, germanium based devices, or other lattice mismatched materials based devices onto a Si substrate for Complementary Metal-Oxide Semiconductor ("CMOS") systems is difficult.

DESCRIPTION OF THE EMBODIMENTS

Figure 1:
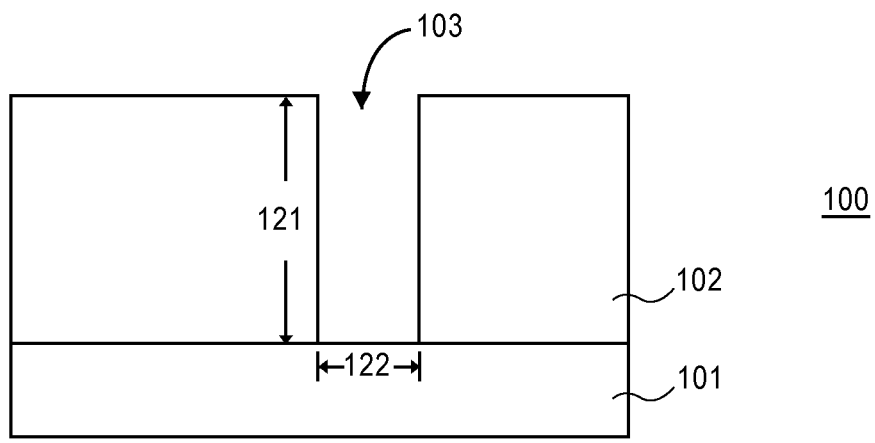
FIG. 1 shows a cross-sectional view of an electronic device structure according to one embodiment.

In the following description, numerous specific details, such as specific materials, dimensions of the elements, etc. are set forth in order to provide a thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description. While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art. Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments. Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Methods and apparatuses to manufacture selective epitaxally grown III-V materials based devices are described herein. A first buffer layer is deposited into a trench in an insulating layer on a substrate. A second buffer layer is deposited onto the first buffer layer. A device layer is deposited on the second buffer layer. In an embodiment, the second buffer layer has a lattice parameter that matches the lattice parameter of the device channel layer. In an embodiment the second buffer layer may vary the lattice parameter, even exceeding the target buffer layer lattice parameter (i.e., the lattice parameter of the second buffer may be graded and may include portions less than, equal to, or greater than lattice parameters of the device layer and/or the first buffer layer), to quickly annihilate defects. In an embodiment, the first buffer layer has a lattice parameter between the lattice parameter of the substrate and the device channel layer. The first buffer layer may have a lattice parameter substantially equal to the lattice parameter of the second buffer layer and/or the lattice parameter of the channel layer. In an embodiment, at least one of the first buffer layer, the second buffer layer, and the device layer is a III-V material based layer, and the substrate is a Si substrate. In an embodiment, a cap layer is deposited on the device layer. In an embodiment, a fin comprising the device layer is formed. In an embodiment, a gate dielectric is deposited over the fin and source and drain regions are formed in the fin. In an embodiment, the device layer includes a channel layer.

It at least some embodiments, a multilayer stack comprises a first III-V material based buffer layer on a Si substrate. A second III-V material based buffer layer is deposited onto the first III-V material based buffer layer. The multilayer stack, comprising the second III-V material based buffer layer on the first III-V materials based buffer layer, is deposited in a trench in an insulating layer on the Si substrate. The multilayer stack allows III-V material integration on Si using a selective epitaxy approach. Selective epitaxial growth involves growing the multi-layer stack in the trench in the insulating layer on the Si substrate. The trench in the insulating layer on the substrate has an aspect ratio (depth to width (D/W)) such that the defects originating from the lattice mismatch growth are captured within the buffer layers deposited in the trench (and largely excluded from the channel or device layer). This concerns a form of aspect-ratio-trapping (ART).

Buffer layers grown selectively between the substrate and a device layer provide an advantage of capturing dislocation defects within the bottom buffer layers thereby reducing the defects that propagate to the device layers. The layer stack combination(s) as described herein provide an advantage of accommodating greater lattice mismatch between a Si substrate and a III-V device layer while also providing isolation between the channel and substrate due to band offset. In an embodiment, the III-V device layer is InGaAs with high indium ("In") composition (e.g., at least 53%). As used herein, "53%" is a common means by which persons of ordinary skill in the art concerning III-V materials refer to these films. This nomenclature indicates 53% of the Group III elements present in the InGaAs material are In, and the balance (47%) is Ga. This nomenclature is to be interpreted in light of a more scientifically accurate rendering which would refer to the "53%" composition as $In_{26.5}Ga_{23.5}As_{50}$.

Embodiments of a layer stack comprising multiple buffer layers as described herein accommodates lattice mismatch between Si substrate and the III-V device channel layer. The hetero-integrated solution described herein can be utilized to make various device architectures (e.g., trigate device, nanowire, nanoribbon, and the like).

FIG. 1 shows a cross-sectional view 100 of a III-V materials based electronic device structure according to one embodiment. A trench 103 is formed in an insulating layer 102 to expose a substrate 101.

In one embodiment, the substrate 101 includes a semiconductor material (e.g., monocrystalline Si, germanium ("Ge"), silicon germanium ("SiGe"), a III-V materials based material (e.g., gallium arsenide ("GaAs")), or any combination thereof). In one embodiment, the structure 100 includes metallization interconnect layers for integrated circuits. In at least some embodiments, the structure 100 includes electronic devices (e.g., transistors, memories, capacitors, resistors, optoelectronic devices, switches, and any other active and passive electronic devices that are separated by an electrically insulating layer, such as an interlayer dielectric, a trench insulation layer, or any other insulating layer known to one of ordinary skill in the art of the electronic device manufacturing). In at least some embodiments, the structure 100 (or in layers above the structure 100) includes interconnects (e.g., vias) configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above (e.g., Si).

Insulating layer 102 can be any material suitable to insulate adjacent devices and prevent current leakage. In one embodiment, electrically insulating layer 102 is an oxide layer (e.g., silicon dioxide), or any other electrically insulating layer. In one embodiment, insulating layer 102 comprises an interlayer dielectric (ILD), such as silicon dioxide. In one embodiment, insulating layer 102 may include polyimide, epoxy, photodefinable materials (e.g., benzocyclobutene (BCB)), WPR-series materials, and/or spin-on-glass. In one embodiment, insulating layer 102 is a low permittivity (low-k) ILD layer. Typically, low-k refers to the dielectrics having a dielectric constant (permittivity k) lower than the permittivity of silicon dioxide.

In one embodiment, insulating layer 102 is a shallow trench isolation (STI) layer that provides field isolation regions that isolate one fin from other fins on substrate 101. In one embodiment, the thickness of the layer 102 is in the approximate range of 500 angstroms (Å) to 10,000 Å. The insulating layer 102 can be blanket deposited using any of the techniques known to one of ordinary skill in the art, such as but not limited to chemical vapor deposition (CVD) and physical vapor deposition (PVP).

In an embodiment, the insulating layer 102 is patterned and etched to form trenches, such as trench 103 using one of the patterning and etching techniques known to one of ordinary skill in the art. Trench 103 has a depth D 121 and a width W 122. An aspect ratio of the trench 103 (D/W) determines the thickness of the buffer layers deposited through that trench in some embodiments. The higher the D/W ratio of the trench, the thicker the buffer layers are in some embodiments. In an embodiment, the buffer layers deposited through the trench onto the substrate are thick enough so that most of the defects originated from the lattice mismatch are trapped within that buffer layers and are prevented from propagating into a device layer formed on the buffer layers. In an embodiment, the aspect ratio of the trench (D/W) is at least 1.5, and more specifically, at least 3. Other embodiments include a higher aspect ratio, such as 10:1 or 20:1 or even higher to provide better transistor performance. In an embodiment, the width of the trench is determined by the width of the electronic device. The electronic device can be for example a tri-gate device, a nanowire based device, a nanoribbon based device, or any other electronic device. For example, the width of the trench 103 for a tri-gate transistor can be from about 5 nm to about 80 nm. For example, the width of the trench 103 for a nanotube device or a nanowire device can be from about 5 nm to about 80 nm. In an embodiment, the depth of the trench is at least three times greater than the width of the trench. For example, for a tri-gate transistor the depth of the trench 103 can be from about 250 nm to about 600 nm, and more specifically, from about 300 nm to about 400 nm.

The trench 103 in the insulating layer 102 can have a square, rectangular, round, oval, or any other shape to expose the underlying substrate 101. In at least some embodiments, the width of the trench is from about 20 nm to about 300 nm. In at least some embodiments, the depth of the trench is from about 60 nm to about 600 nm.

Figure 2:
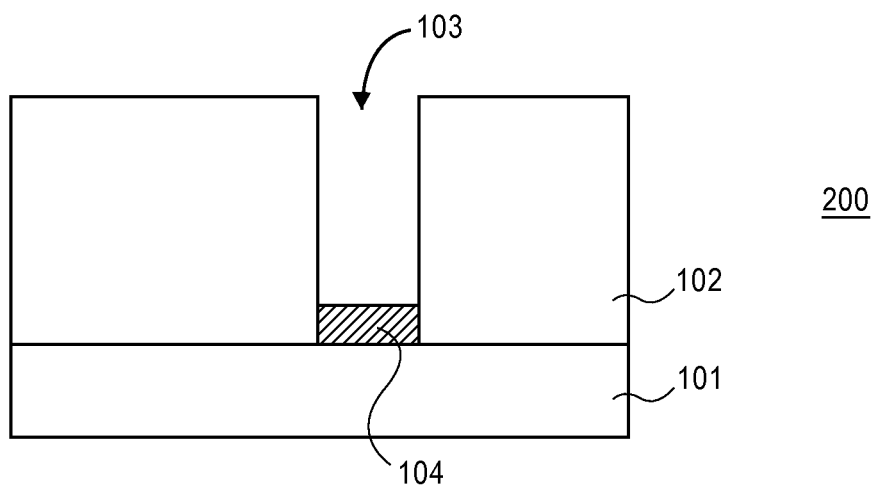
FIG. 2 is a cross-sectional view similar to FIG. 1, after a first buffer layer is deposited on a substrate according to one embodiment.

FIG. 2 is a cross-sectional view 200 similar to FIG. 1, after a first buffer layer is deposited on a substrate according to one embodiment. A first buffer layer 104 is selectively deposited through trench 103 onto the exposed portion of substrate 101. In an embodiment, buffer layer 104 has a lattice parameter between the lattice parameter of the substrate 101 and a device layer which will be formed thereon. Generally, a lattice constant is a lattice parameter that is typically referred to as a distance between unit cells in a crystal lattice. Lattice parameter is a measure of the structural compatibility between different materials. In another embodiment the lattice constant of buffer 104 will be generally equal to the channel later eventually formed thereon.

Material for the buffer layer 104 is chosen such that the lattice constant of the first buffer layer 104 ("$LC_1$") is in between the lattice constant of Si ("$LC_{si}$") and a device channel layer ("$LC_{dc}$"). In another embodiment material for the buffer layer 104 is chosen such that the lattice constant of the first buffer layer 104 is generally equal to the lattice constant of a device channel layer. In an embodiment, substrate 101 is a Si substrate, and buffer layer 104 comprises a III-V material. Generally, the III-V material refers to a compound semiconductor material that comprises at least one group III element of the periodic table (e.g., aluminum ("Al"), gallium ("Ga"), and/or indium ("In")) and at least one of group V element of the periodic table (e.g., nitrogen ("N"), phosphorus ("P"), arsenic ("As"), and/or antimony ("Sb")). In an embodiment, buffer layer 104 is InP, GaAs, InAlAs, GaAsSb, another III-V material, or any combination thereof. In an embodiment, the lattice constant of the first buffer layer 104 is such that a ratio $R=(LC_1-LC_{si})/LC_{si}$ is from about 4% to about 8%.

In an embodiment, the thickness of the first buffer layer 104 is at least about 5 nm, and more specifically, at least about 50 nm.

In an embodiment, buffer layer 104 is deposited through trench 103 onto the exposed portion of substrate 101 using a selective area epitaxy. As shown in FIG. 2, epitaxial buffer layer 104 is locally grown on the exposed portion of semiconductor substrate 101 through trench 103. Epitaxial buffer layer 104 can be selectively deposited through trench 103 onto the exposed portion of substrate 101 using one of the epitaxial techniques known to one of ordinary skill in the art of electronic device manufacturing (e.g., CVD, metallo organic chemical vapor deposition ("MOCVD"), atomic layer deposition ("ALD"), or other epitaxial growth technique known to one of ordinary skill in the art of electronic device manufacturing). In an embodiment, the first epitaxial buffer layer of InP is deposited through trench 103 onto the exposed portion of substrate 101 by a MOCVD technique at a temperature from about 300° C. to about 450° C., and more specifically, at about 375° C. In another embodiment layer 104 includes $GaAs_{49}Sb_{51}$. In another embodiment layer 104 includes $GaAs_{36}Sb_{64}$. In another embodiment layer 104 includes GaAs.

Figure 3:
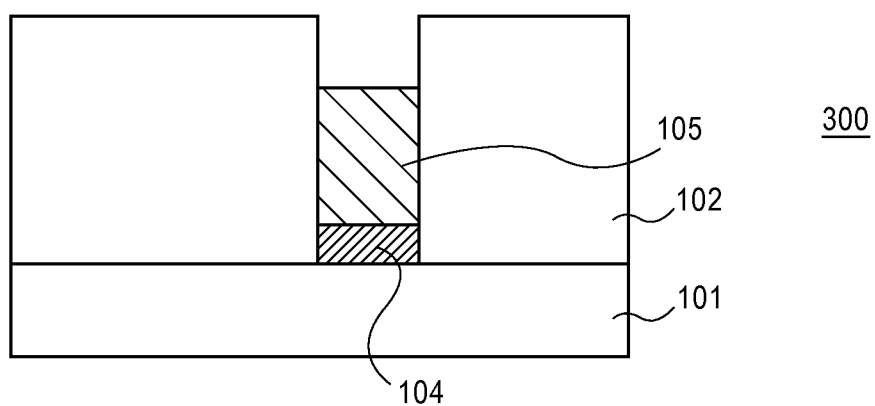
FIG. 3 is a cross-sectional view similar to FIG. 2, after a second buffer layer is deposited onto the first buffer layer according to one embodiment.

FIG. 3 is a cross-sectional view 300 similar to FIG. 2, after a second buffer layer is deposited onto the first buffer layer according to one embodiment. A second buffer layer 105 is selectively deposited through trench 103 onto buffer layer 104. In an embodiment, second buffer layer 105 comprises a III-V material. In an embodiment, second buffer layer 105 is indium aluminum arsenide ("$In_xAl_{1-x}As$"), indium gallium arsenide antimonide ("$In_xGa_{1-x}AsSb$"), AsSb combined with another III-V material, AlAsSb, $AlAs_{54}Sb_{46}$, $AlAs_{42}Sb_{58}$, $AlAs_xSb_{1-x}$, another III-V material, or any combination thereof. In an embodiment, second buffer layer 105 is deposited onto the first buffer layer 104 of another III-V material. In an embodiment, second III-V material based buffer layer 105 has a lattice parameter that matches the lattice parameter of a III-V material based device channel layer. In an embodiment, second III-V material based buffer layer 105 has a lattice parameter that matches the lattice parameter of the device layer of the III-V material that has high indium content (e.g., where In is at least 53% of the group III atoms), (e.g., $In_xAl_{1-x}As$, $In_xGa_{1-x}As$, where x is at least 0.53). In an embodiment, second buffer layer 105 has a lattice parameter that matches the lattice parameter of the device layer of the III-V material that has at least 70% atom fraction of indium content (e.g., $In_xAl_{1-x}As$, $In_xGa_{1-x}As$, where x is at least 0.7).

In an embodiment, the device channel layer is indium gallium arsenide ("InGaAs"), and buffer layer 105 is $In_xAl_{1-x}As$, $In_xGa_{1-x}AsSb$, $AlAs_{54}Sb_{46}$, $AlAs_{42}Sb_{58}$, $AlAs_xSb_{1-x}$, or any combination thereof. In an embodiment, the choice of second buffer material that has a bottom interface with the first buffer layer and a top interface with the device channel layer is such that the lattice constant of the second buffer layer matches the lattice constant of the channel layer. In an embodiment, the thickness of the second buffer layer 105 is at least about 200 nm.

In an embodiment, buffer layer 105 is deposited through trench 103 onto the buffer layer 104 using a selective area epitaxy. As shown in FIG. 2, epitaxial buffer layer 105 is locally grown on the first buffer layer 104 through trench 103. Epitaxial buffer layer 105 can be selectively deposited through trench 103 onto the first buffer layer 104 using one of epitaxial techniques known to one of ordinary skill in the art of electronic device manufacturing (e.g., CVD, MOCVD, ALD, or other epitaxial growth technique known to one of ordinary skill in the art of electronic device manufacturing). In an embodiment, the second epitaxial buffer layer is deposited through trench 103 onto the first buffer layer 104 by a MOCVD technique at a temperature from about 425° C. to about 650° C., and more specifically, from about 520° C. to about 580° C. In an embodiment metalorganic vapour phase epitaxy (MOVPE) may be used to deposit the second epitaxial layer at a temperature from about 425° C. to about 650° C., and more specifically, from about 520° C. to about 580° C.

Figure 4:
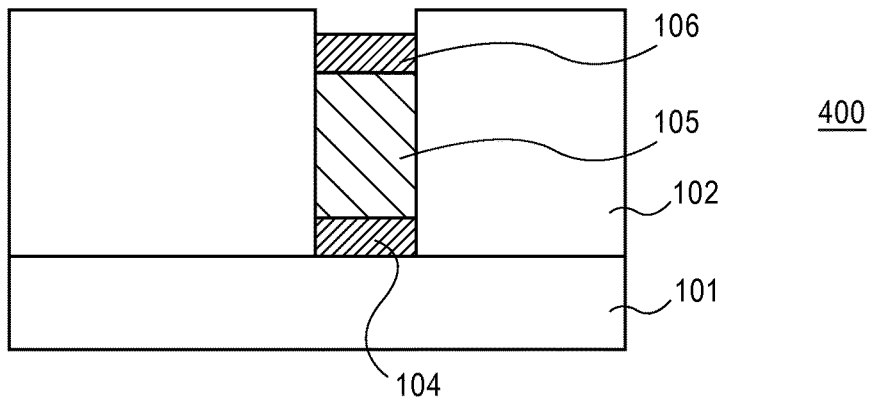
FIG. 4 is a cross-sectional view similar to FIG. 3, after a device layer is deposited onto the second buffer layer according to one embodiment.

FIG. 4 is a cross-sectional view 400 similar to FIG. 3, after a device layer is deposited onto the second buffer layer according to one embodiment. A device layer 106 is selectively deposited through trench 103 onto second buffer layer 105. In an embodiment, device layer 106 comprises a device channel layer. The second buffer layer 105 has a lattice parameter that matches the lattice parameter of device layer 106. In an embodiment the first buffer layer 104 has a lattice parameter that matches the lattice parameter of device layer 106. In an embodiment, device layer 106 comprises a III-V material, for example, InGaAs, and/or InGaAsSb that has high indium content (e.g., indium is at least 53% of the group III atoms (e.g., $In_xGa_{1-x}As$, $In_xGa_{1-x}AsSb$, where x is at least 0.53)). In an embodiment, device layer 105 comprises InGaAs, and/or InGaAsSb that contains at least 70% of indium (atomic ratio of Group III atoms) (e.g., $In_xGa_{1-x}As$, $In_xGa_{1-x}AsSb$, where x is at least 0.7).

In an embodiment, the device channel layer 106 is InGaAs and the second buffer layer 105 is InAlAs, InGaAsSb, AlAsSb, GaAsSb or any combination thereof. In an embodiment, the lattice constant of the III-V material of the second buffer layer matches the lattice constant of the III-V material of the device layer 106, as described above. The thickness of the device layer 106 is determined by a device design. In an embodiment, the thickness of the device layer 106 is from about 1 nm to about 100 nm.

In an embodiment, device layer 106 is deposited through trench 103 onto the buffer layer 105 using a selective area epitaxy. As shown in FIG. 4, device layer 106 is locally grown on the buffer layer 105 through trench 103. Epitaxial device layer 106 can be selectively deposited through trench 103 onto the buffer layer 105 using one of epitaxial techniques known to one of ordinary skill in the art of electronic device manufacturing (e.g., CVD, MOCVD, ALD, or other epitaxial growth technique known to one of ordinary skill in the art of electronic device manufacturing). In an embodiment, the device layer of InGaAs is deposited through trench 103 onto the buffer layer 105 by a MOCVD technique at temperature from about 400° C. to about 650° C., and more specifically, from about 520° C. to about 580° C.

Figure 5:
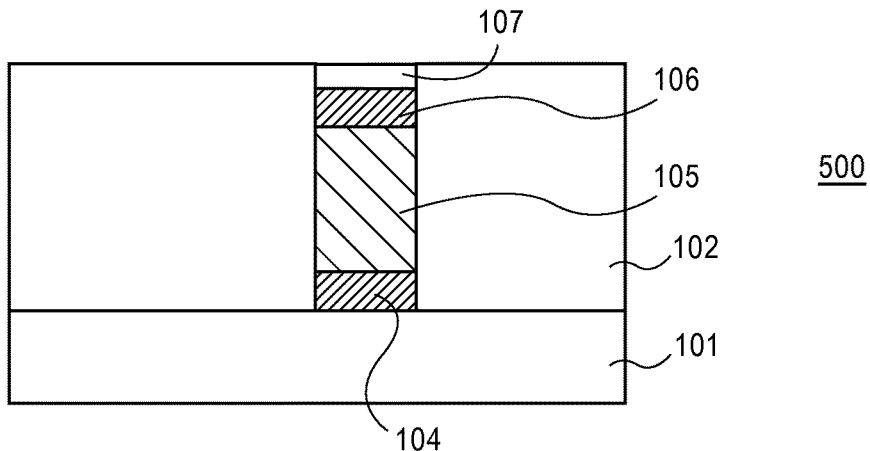
FIG. 5 is a cross-sectional view similar to FIG. 4, after a thin cap layer is optionally grown on the device layer according to one embodiment.

FIG. 5 is a cross-sectional view 500 similar to FIG. 4, after a thin cap layer is optionally grown on the device layer according to one embodiment. A thin cap layer can be optionally deposited onto the device layer 106 as an interface with high-k gate dielectrics (e.g., $TaSiO_x$), to improve the control of the gate. A thin cap layer 107 can be selectively deposited through trench 103 onto device layer 106. In an embodiment, cap layer 107 comprises a III-V material. In an embodiment, cap layer 107 is InP. In an embodiment, the thickness of the cap layer 107 is from about 0.5 nm to about 3 nm.

In an embodiment, cap layer 107 is deposited through trench 103 onto the device layer 106 using a selective area epitaxy. As shown in FIG. 5, cap layer 107 is locally grown on the device layer 107 through trench 103. Cap layer 107 can be selectively deposited through trench 103 onto the device layer 106 using CVD, MOCVD, ALD, or other epitaxial growth technique known to one of ordinary skill in the art of electronic device manufacturing.

Figure 6:
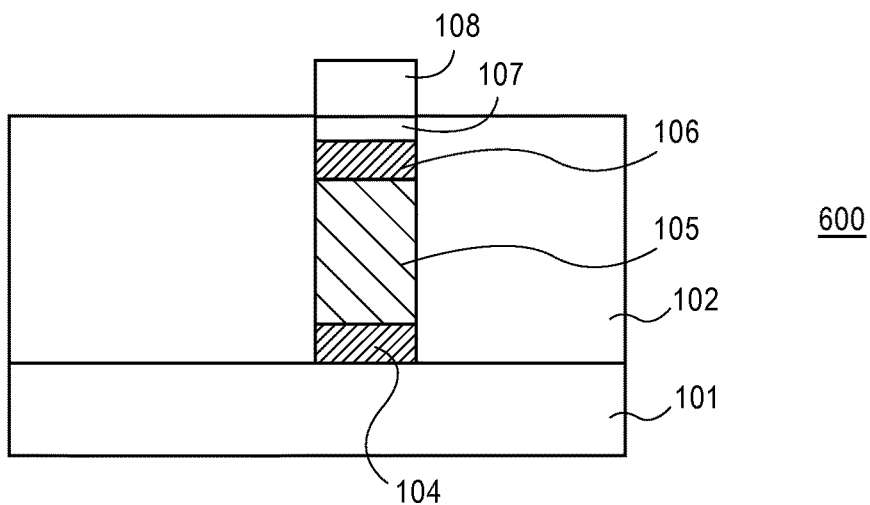
FIG. 6 is a cross-sectional view similar to FIG. 5, after a heavily doped layer is deposited over the device layer according to one embodiment.

FIG. 6 is a cross-sectional view 600 similar to FIG. 5, after a heavily doped layer is deposited over the device layer according to one embodiment.

In an embodiment, heavily doped layer 108 is deposited over the device layer to provide a source (S) and a drain (D) for a transistor device. As shown in FIG. 6, a multilayer stack is selectively grown in the trench 103 and on substrate 101. The stack comprises a heavily doped layer 108 on cap layer 107, which is on device layer 106, which is on second buffer layer 105, which is on first buffer layer 104, which is on substrate 101. In an embodiment, heavily doped source/drain layer 108 is removed from the gate region later in a process and left in source/drain regions during transistor fabrication. In an embodiment the cap layer 107 is deposited further along in the flow (e.g., after patterning has occurred which reveals only the gate portion of the device). In an embodiment the heavily doped layer 108 is deposited further along in the flow (e.g., after patterning has occurred which reveals only the source and drain portions of the device).

In an embodiment, heavily doped source/drain layer 108 comprises a III-V material. In an embodiment, heavily doped layer 108 has a concentration of dopants between $1\times10^{19}$ and $1\times10^{21}$ atoms/cm$^3$ and comprises a III-V material that is similar to the III-V material of the device layer 107. In an embodiment, the thickness of the source/drain layer 108 is determined by a device design. In an embodiment, the thickness of the source/drain layer 108 is from about 10 nm to about 100 nm. In a more specific embodiment, the thickness of the source/drain layer 108 is about 40 nm. In an embodiment, source/drain layer 108 is deposited through trench 103 onto the cap layer 107 using a selective area epitaxy. Source/drain layer 108 can be selectively deposited through trench 103 onto the cap layer 107 using CVD, MOCVD, ALD, or other epitaxial growth technique known to one of ordinary skill in the art of electronic device manufacturing. In an embodiment the highly doped layer 108 is deposited after formation of a trigate fin, directly onto the channel material 106.

Figure 11:
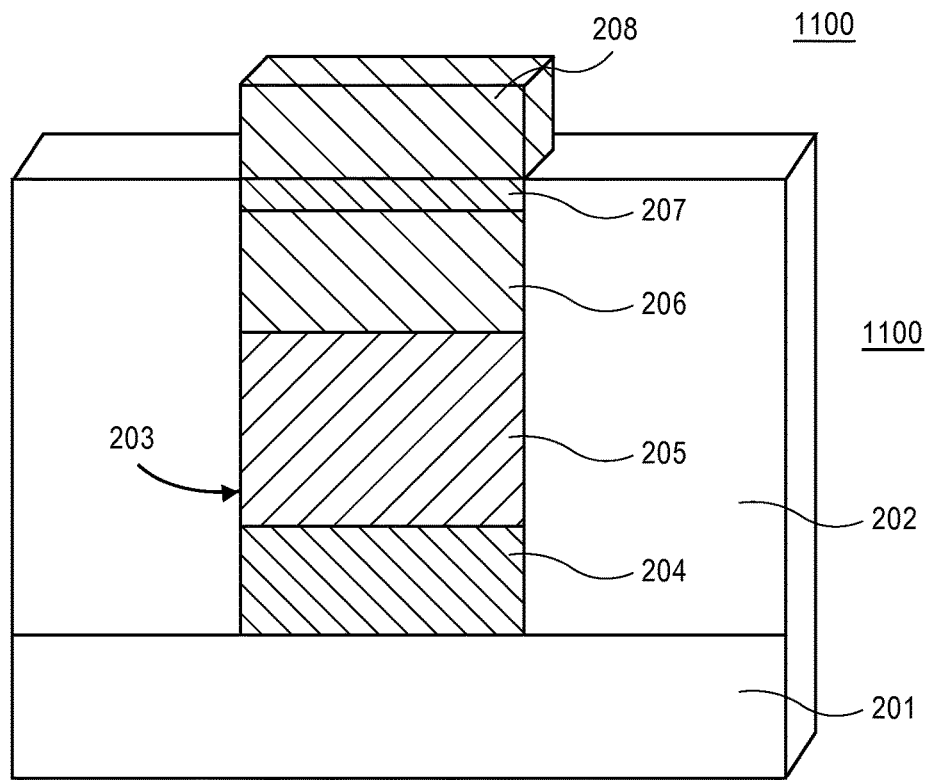
FIG. 11 is a perspective view of the multilayer stack as depicted in FIG. 6 according to one embodiment.

FIG. 11 is a perspective view 1100 of the multilayer stack as depicted in FIG. 6 according to one embodiment. A multilayer stack comprises a first buffer layer 204 in a trench formed in an insulating layer 202 on a substrate 201. A second buffer layer 205 is deposited on the first buffer layer 204 and a device channel layer 206 on the second buffer layer. The second buffer layer 205 has a lattice parameter that matches the lattice parameter of the device channel layer 206. The first buffer layer 204 has a lattice parameter between the lattice parameter of the substrate 201 and the device channel layer 206, as described above. The first buffer layer may have the same lattice constant as the second buffer layer in an embodiment. The first buffer layer may have the same lattice constant as the channel layer in an embodiment. The first buffer layer may have the same lattice constant as the channel layer and the second buffer layer in an embodiment. In an embodiment the lattice constant of layer 205 may vary along the height of the trench 203 to bridge the lattice constant delta/difference between layers 204 and 206.

In an embodiment, each of the first buffer layer 204, second buffer layer 205, and device channel layer 206 is a III-V material based layer, and the substrate 201 is a Si substrate, as described above. A cap layer 207 is optionally deposited on the device channel layer 206, as described above. In an embodiment, each of the first buffer layer 204, the second buffer layer 205, the device channel layer 206, and the cap layer 207 is deposited by CVD.

Typically, when lattice mismatched films are incorporated together, defects are formed. These defects once formed, propagate up the lattice at an angle. An embodiment of the multilayer stack comprises a first buffer layer 204 in a trench 203 in an insulating layer 202 on a substrate 201, a second buffer layer 205 on the first buffer layer 204; and a device channel layer 206 on the second buffer layer 205, wherein the second buffer layer 205 has a lattice parameter that matches the lattice parameter of the device channel layer 206, and wherein the first buffer layer 204 has a lattice parameter between the lattice parameter of the substrate 201 and the device channel layer 206 allows (or equal to the lattice constant of the second buffer layer and/or channel layer) to move a defect terminated interface well below the actual device channel layer 206 such that device performance is not affected.

Figure 7:
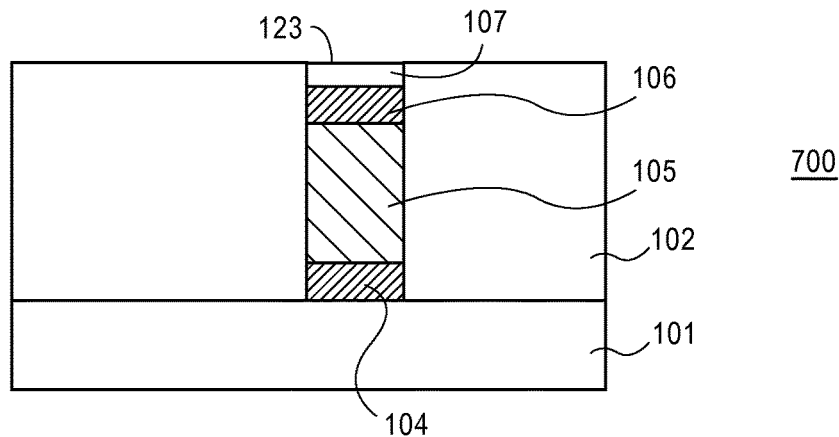
FIG. 7 is a cross-sectional view similar to FIG. 6, after a heavily doped source/drain layer is removed from a gate region of the device according to one embodiment.

FIG. 7 is a cross-sectional view 700 similar to FIG. 6, after the heavily doped source/drain layer is removed from a gate region 123 of the device according to one embodiment. Heavily doped source/drain layer 108 is left intact on source/drain regions (not shown) of the device layer 106.

Figure 8:
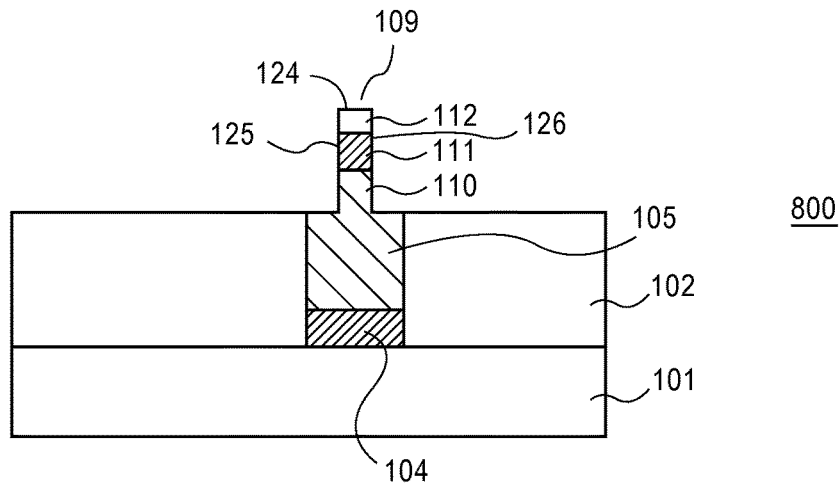
FIG. 8 is a cross-sectional view similar to FIG. 7, after a device fin is formed according to one embodiment.

FIG. 8 is a cross-sectional view 800 similar to FIG. 7, after a device fin is formed according to one embodiment. As shown in FIG. 8, a device fin 109 comprises a portion of the optional cap layer 112 on a portion of the device layer 111 on a portion of the second buffer layer 110. Some, none, or a significant portion of layer 105 may be etched in other embodiments. As shown in FIG. 8, fin 108 has a top surface 124, and opposing sidewalls 125 and 126. In an embodiment, forming fin 109 involves depositing a patterned hard mask onto cap layer 107 and then recessing insulating layer 102 down to a depth determined by a device design as known to one of ordinary skill in the art of electronic device manufacturing. In one embodiment, insulating layer 102 is recessed by a selective etching technique while leaving the fin 109 intact. For example, insulating layer 102 can be recessed using a selective etching technique known to one of ordinary skill in the art of electronic device manufacturing, such as but not limited to wet etching and/or dry etching with a chemistry having substantially high selectivity to the fin on the substrate 101. This means that the chemistry predominantly etches the insulating layer 102 rather than the fin of the substrate 101. In one embodiment, a ratio of the etching rates of the insulating layer 102 to the fin is at least 10:1.

As shown in FIG. 8, the patterned hard mask is removed from the fin 109. The patterned hard mask layer can be removed from the top of the fin 109 by a polishing process (e.g., CMP) as known to one of ordinary skill in the art of electronic device manufacturing. As shown in FIG. 8, insulating layer 102 is recessed down to a predetermined depth that defines the height of the device fin 109 relative to a top surface of the insulation layer 102. The height and the width of the fin 109 are typically determined as a design choice. In an embodiment, the height of the fin 109 is from about 10 nm to about 100 nm and the width of the fin 109 is from about 5 nm to about 20 nm. In an embodiment the original trench dimensions dictate the fin dimensions (e.g., width of fin).

Figure 9:
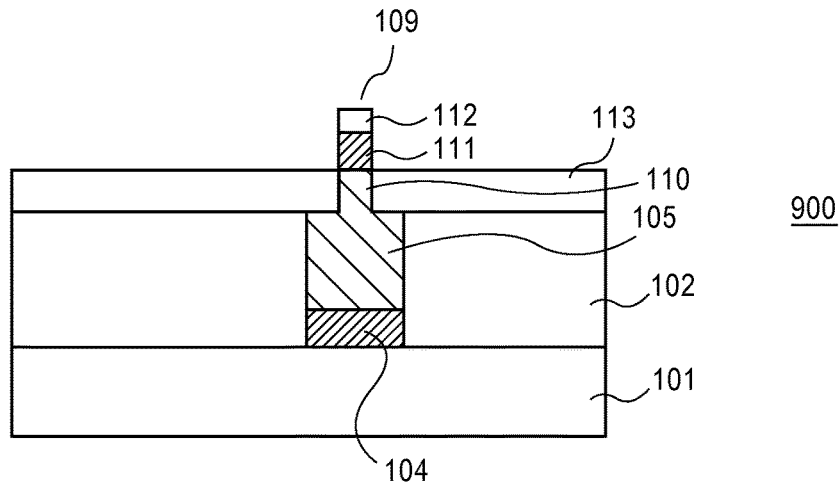
FIG. 9 is a cross-sectional view similar to FIG. 8, after an insulating layer is deposited onto another insulating layer that is adjacent to the sidewalls of the portion of the first buffer layer according to one embodiment.

FIG. 9 is a cross-sectional view 900 similar to FIG. 8, after an insulating layer 113 is deposited onto insulating layer 102 adjacent to the sidewalls of the portion of the first buffer layer 110 according to one embodiment. In an embodiment, insulating layer 113 can be any material suitable to insulate adjacent devices and prevent leakage from the fins. In one embodiment, electrically insulating layer 113 is an oxide layer (e.g., silicon dioxide, or any other electrically insulating layer determined by a design). In one embodiment, insulating layer 113 is a STI layer to provide field isolation regions that isolate one fin from other fins on substrate 101. In one embodiment, the thickness of the insulating layer 113 corresponds to the thickness of the portion of the second buffer layer 110 that is determined by a fin device design. In an embodiment, the thickness of the insulating layer 113 is in the approximate range of 1 nm to about 30 nm. The insulating layer 113 can be blanket deposited using any of techniques known to one of ordinary skill in the art of electronic device manufacturing, such as but not limited to CVD, PVP, and the like.

Figure 10:
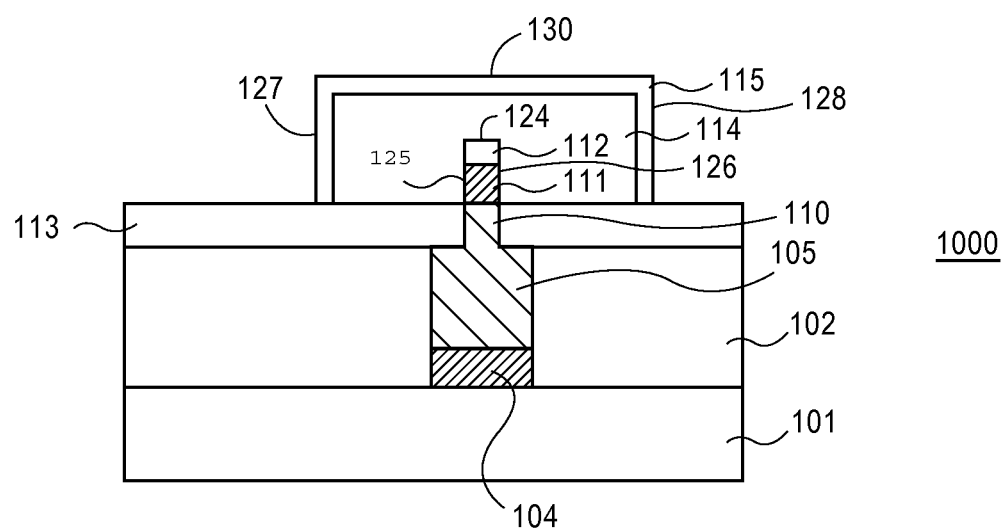
FIG. 10 is a cross-sectional view similar to FIG. 9, after a gate dielectric layer and a gate electrode layer are deposited over the fin according to one embodiment.

FIG. 10 is a cross-sectional view of a device 1000 similar to FIG. 9, after a gate dielectric layer and a gate electrode layer are deposited over the fin according to one embodiment. A gate dielectric layer 114 is formed on and around three sides of the semiconductor fin 109. As shown in FIG. 10, gate dielectric layer 114 is formed on or adjacent to top surface 124, on or adjacent to sidewall 125, and on or adjacent to sidewall 126 of fin 109. Gate dielectric layer 114 can be any well-known gate dielectric layer.

In one embodiment, gate dielectric layer 114 is a high-k dielectric material having a dielectric constant greater than the dielectric constant of silicon dioxide. In one embodiment, electrically insulating layer 114 comprises a high-k dielectric material, such as a metal oxide dielectric. For example, gate dielectric layer 114 can be, without limitation, tantalum silicon oxide ($TaSiO_x$), pentaoxide ($Ta_2O_5$), titanium oxide ($TiO_2$), zirconium oxide ($ZrO_2$), hafnium oxide ($HfO_2$), lanthanum oxide ($La_2O_4$), lead zirconium titanate (PZT), and/or other high-k dielectric material, or a combination thereof. In an embodiment, the gate dielectric layer 114 is a silicon dioxide ($SiO_2$), silicon oxynitride ($SiO_xN_y$) or a silicon nitride ($Si_3N_4$) dielectric layer. In an embodiment, the thickness of the gate dielectric layer 114 is in the approximate range between about 1 nm to about 20 nm, and more specifically, between about 5 nm to about 10 nm.

As shown in FIG. 10, a gate electrode layer 115 is deposited on the gate dielectric layer 114 on the fin 109. Gate electrode 115 is formed on and around the gate dielectric layer 114 as shown in FIG. 10. Gate electrode 115 is formed on or adjacent to gate dielectric 114 on sidewall 125 of semiconductor fin 109, is formed on gate dielectric 114 on the top surface 124 of semiconductor fin 109, and is formed adjacent to or on gate dielectric layer 114 on sidewall 126 of semiconductor fin 109.

As shown in FIG. 10, gate electrode 115 has a top 130 and a pair of laterally opposite sidewalls, such as a sidewall 127 and a sidewall 128 separated by a distance which defines the length of the channel of the fin device. Gate electrode 115 can be formed of any suitable gate electrode material. In an embodiment, the gate electrode 115 is a metal gate electrode, such as but not limited to, tungsten, tantalum, titanium, and their nitrides and ruthenium, rhodium and platinum. It is to be appreciated that the gate electrode 115 needs not necessarily be a single material and can be a composite stack of thin films, such as but not limited to a polycrystalline Si/metal electrode or a metal/polycrystalline Si electrode. In an embodiment, gate electrode 115 comprises of polycrystalline Si doped to a concentration density between $1\times10^{19}$ atoms/$cm^3$ to $1\times10^{20}$ atoms/$cm^3$.

Figure 12:
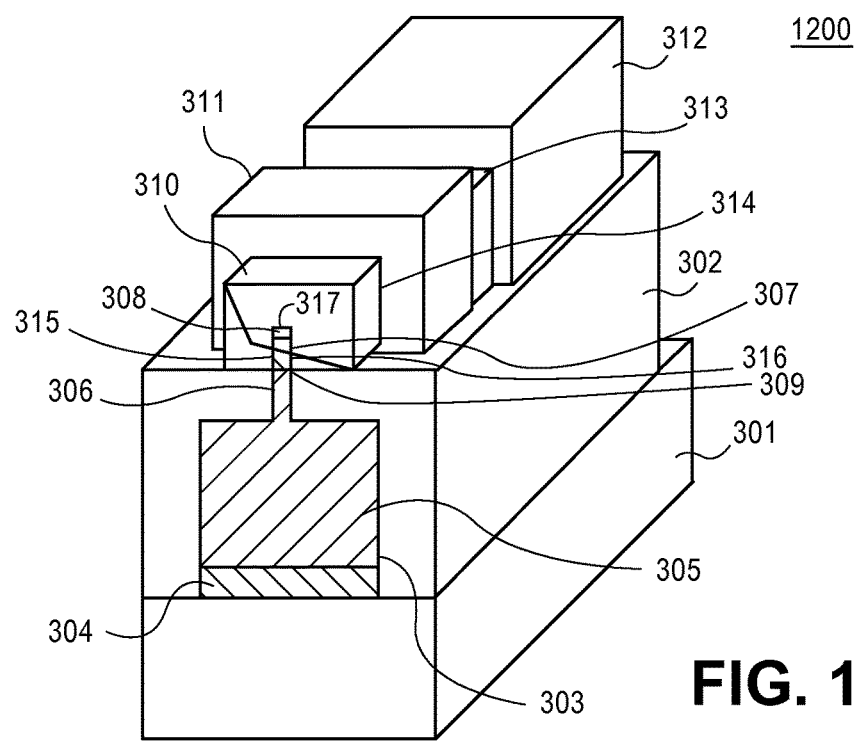
FIG. 12 is a perspective view of a portion of a tri-gate transistor as depicted in FIG. 10 according to one embodiment.

FIG. 12 is a perspective view 1200 of a portion of a tri-gate transistor as depicted in FIG. 10 according to one embodiment. As shown in FIG. 12, a tri-gate transistor includes an electrically insulating layer 302 on a substrate 301 adjacent to a fin 309. In one embodiment, the tri-gate transistor is coupled to one or more layers of metallization (not shown). The one or more metallization layers can be separated from adjacent metallization layers by dielectric material (e.g., ILD (not shown)). The adjacent metallization layers may be electrically interconnected by vias (not shown).

As shown in FIG. 12, a fin 309 protrudes from a top surface of insulating layer 302. Fin 309 comprises an optional III-V material based cap layer 308 on a III-V material based device channel layer 307 on a portion 306 of a III-V material based second buffer layer 305 on a III-V material based first buffer layer 304. A gate electrode 311 is formed on and around the gate dielectric 310.

The fin 309 comprising an optional III-V material based cap layer 308 (e.g., cap layer 308 may wrap around the top and two sidewalls of a trigate fin in some embodiments that use the cap layer) on a III-V material based device channel layer 307 on a portion 306 of a III-V material based second buffer layer 305 on a III-V material based first buffer layer 304, wherein the second buffer layer has a lattice parameter that matches the lattice parameter of the device channel layer, and wherein the first buffer layer has a lattice parameter between the lattice parameter of the substrate and the device layer (or equal to the second buffer layer and/or equal to the channel layer) provides accommodation of the lattice mismatch between the substrate 301 and the device channel layer 307 such that defects can be captured within the thickness of the buffer layers 304 and/or 305.

As shown in FIG. 12, fin 309 has a pair of opposing sidewalls separated by a distance which defines a semiconductor fin width. In one embodiment, the fin width is in an approximate range from about 5 nm to about 50 nm. In one embodiment, the length of the fins is greater than the width and is determined by design choices. In one embodiment, the length of the fins is from about 50 nm to hundreds of microns. In an embodiment, the fin height above the top surface of the insulating layer 302 is in an approximate range from about 5 nm to about 500 nm.

As shown in FIG. 12, a gate electrode 311 is deposited on the gate dielectric 310 on the fin 309. Gate electrode 311 is formed on and around the gate dielectric 310. A source region and a drain region are formed at opposite sides of the gate electrode 311 in a device layer portion 313 of the fin 309. One of source/drain electrodes 312 is formed on the source/drain region at one side of gate electrode 311, and another one of source/drain electrodes (not shown) is formed on the source/drain region at an opposite side of gate electrode 311 using one of techniques known to one of ordinary skill in the art of electronic device manufacturing.

The source and drain regions are formed of the same conductivity type such as N-type or P-type conductivity. In an embodiment, the source and drain regions have a doping concentration of between $1 \times 10^{19}$, and $1 \times 10^{21}$ atoms/cm$^3$. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions can vary in order to obtain a particular electrical characteristic. The portion of the fin 309 located between the source region and drain regions, defines a channel region 314 of the transistor.

The channel region 314 can also be defined as the area of the semiconductor fin 309 surrounded by the gate electrode 311. At times however, the source/drain region may extend slightly beneath the gate electrode through, for example, diffusion to define a channel region slightly smaller than the gate electrode length (L$_g$). In an embodiment, channel region 314 is intrinsic or undoped. In an embodiment, channel region 314 is doped, for example to a conductivity level of between $1 \times 10^{16}$ to $1 \times 10^{19}$ atoms/cm$^3$. In an embodiment, when the channel region is doped it is typically doped to the opposite conductivity type of the source/drain region. For example, when the source and drain regions are N type conductivity the channel region would be doped to P type conductivity. Similarly, when the source and drain regions are P type conductivity the channel region would be N type conductivity. In this manner a tri-gate transistor 100 can be formed into either a NMOS transistor or a PMOS transistor.

Channel regions, such as channel region 314 can be uniformly doped or can be doped non-uniformly or with differing concentrations to provide particular electrical and performance characteristics. For example, channel regions, such as channel region 314, can include well-known halo regions, if desired. As shown in FIG. 12, the tri-gate transistor has a dielectric 310 and a gate electrode 311 surrounding the semiconductor fin 309 on three sides that provides three channels on the fin 309, one channel extends between the source and drain regions on one sidewall of the fin, such as sidewall 315, a second channel extends between the source and drain regions on the top surface of the fin, such as surface 317, and the third channel extends between the source and drain regions on the other sidewall of the fin, such as sidewall 316. However, other embodiments are not so limited and may include an intrinsic channel.

In an embodiment, the source regions of the transistor 1200 are electrically coupled to higher levels of metallization (e.g., metal 1, metal 2, metal 3, and so on) to electrically interconnect various transistors of the array into functional circuits. In one embodiment, the drain regions of the transistor 1200 are coupled to higher levels of metallization (e.g., metal 1, metal 2, metal 3, and so on) to electrically interconnect various transistors of the array together into functional circuits. In an embodiment in the source/drain layer cap layer 308 may be removed or never formed.

Figure 13:
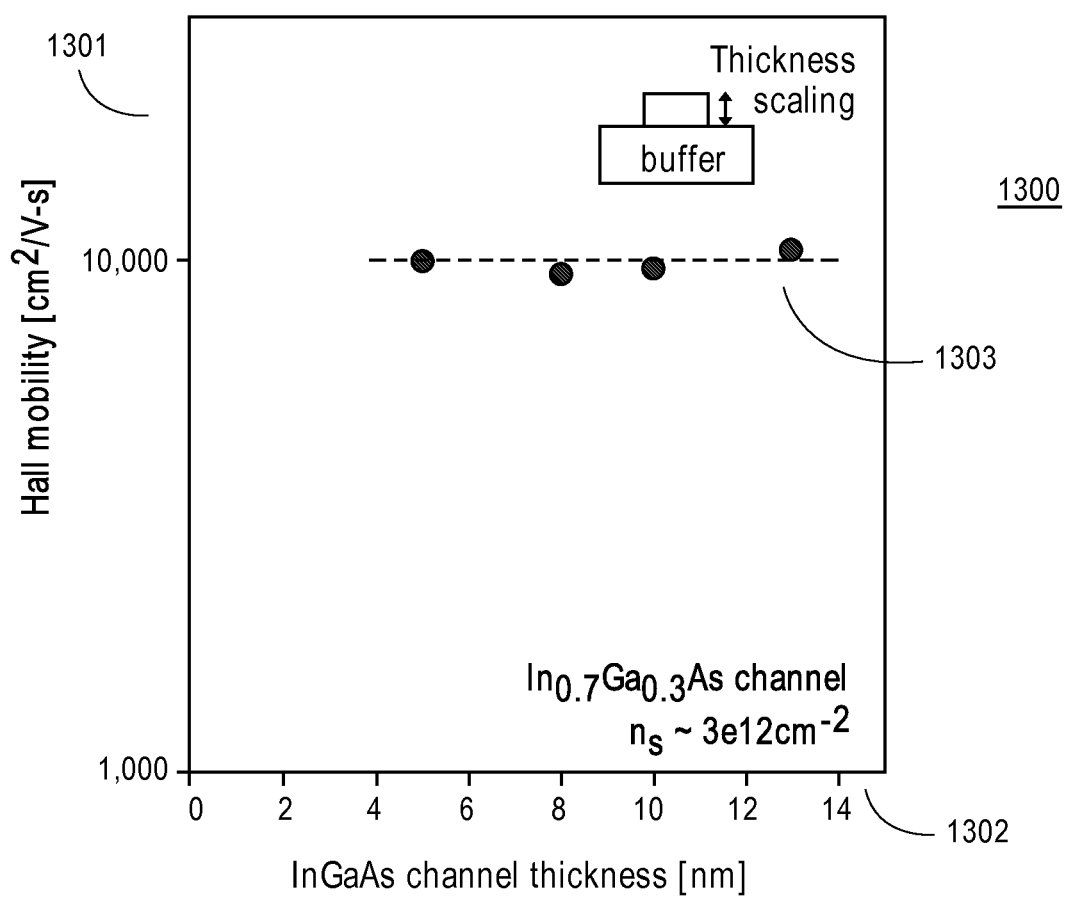
FIG. 13 is an exemplary graph showing a Hall mobility of carriers versus InGaAs channel thickness according to one embodiment.

FIG. 13 is an exemplary graph 1300 showing a Hall mobility of carriers (e.g., electrons, holes) 1301 versus InGaAs channel thickness 1302 according to one embodiment. InGaAs material with high (e.g., at least 70%) indium composition, such as In$_{0.7}$Ga$_{0.3}$As has high carrier mobility that makes it an attractive channel material option for a III-V device. Using InGaAs with high (e.g., at least 70%) indium composition, such as In$_{0.7}$Ga$_{0.3}$As as a device channel layer increases performance of the device and increases device gain. Data 1303 shows that Hall mobility is maintained high at about 10,000 cm$^2$/(V·s) down to a thin device body of 5 nm. There is no impact of surface roughness to mobility of carriers.

Figure 14:
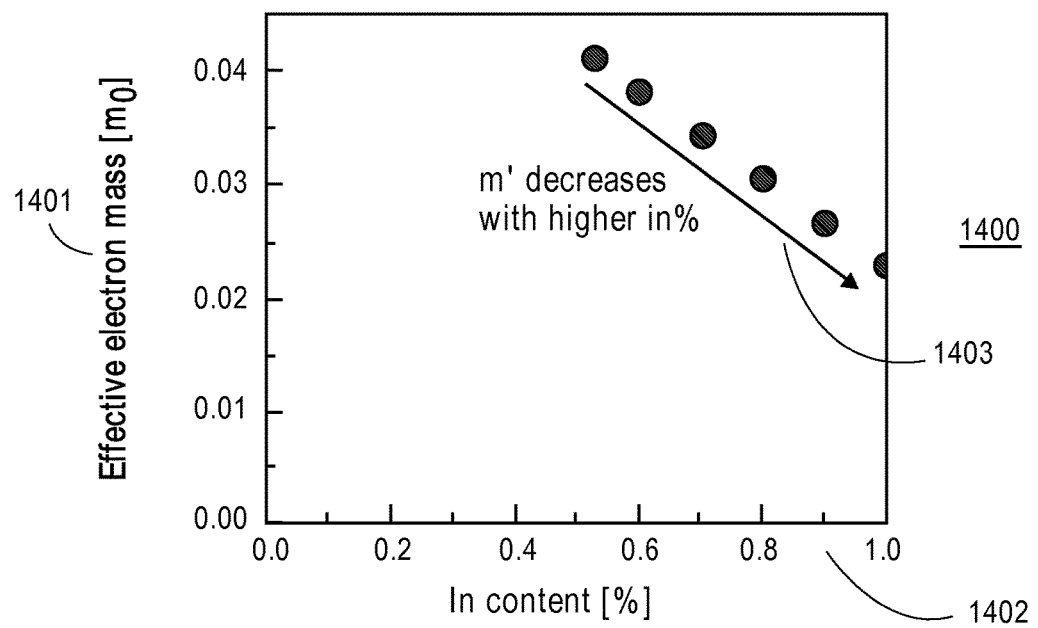
FIG. 14 is an exemplary graph showing an effective electron mass ($m_0$) versus In content (%) according to one embodiment.

FIG. 14 is an exemplary graph 1400 showing an effective electron mass (m$_0$) 1401 versus In content (%) 1402 according to one embodiment. Data 1403 indicate that m$_o$ decreases with higher indium content (%). With a reference to FIG. 12, to increase the height of the fin ("H$_{si}$") in the tri-gate device made using InGaAs having high (e.g., 70%) indium content (e.g., In$_{0.7}$Ga$_{0.3}$As), the lattice mismatch between the channel (e.g., layer 307) and the buffer adjacent to the channel (e.g., buffer layer 305) needs to be minimized in some embodiments. If the lattice mismatch is large, to prevent new defects generation, the thickness of the In$_{0.7}$Ga$_{0.3}$As (and hence H$_{Si}$) needs to be limited to a critical layer thickness. As a result, the buffer layer adjacent to In$_{0.7}$Ga$_{0.3}$As device channel layer has a lattice constant substantially the same (or close to) as the In$_{0.7}$Ga$_{0.3}$As channel in an embodiment. Similar lattice constants of the device channel layer, such as device channel layer 307, and the underlying portion of buffer layer, such as portion 306 of second buffer layer 305, allow (1) trigate H$_{Si}$ to be unlimited (i.e., limiting factor of critical layer is diminished or eliminated), (2) prevents any new defects to be generated at the channel/adjacent bottom buffer interface, and (3) allows all defects that are created at an interface between the second buffer layer and the first buffer layer, such as between buffer layer 305 and buffer layer 303, and all defects that are created at an interface between first buffer layer and Si substrate, such as between buffer layer 303 and substrate 301 in the trench (e.g., trench 303), to be captured well before the device channel layer, such as device channel layer 307.

Figure 15:
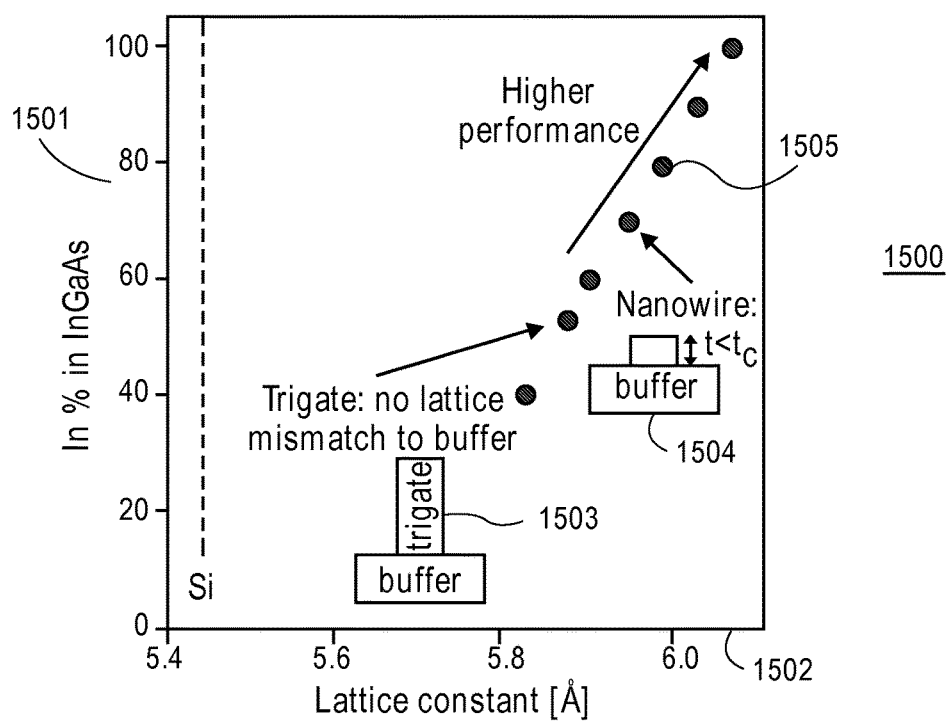
FIG. 15 is an exemplary graph showing an indium content in InGaAs versus a lattice constant according to one embodiment.

FIG. 15 is an exemplary graph 1500 showing an indium content in InGaAs 1501 versus a lattice constant 1502 according to one embodiment. As shown in FIG. 15 higher indium concentration in the InGaAs device allows easier to achieve gate all around ("GAA") Si architecture. Increasing indium content increases a lattice constant of InGaAs. As shown in FIG. 15, a trigate device 1503 needs a new buffer for In$_{0.7}$Ga$_{0.3}$As due to a critical layer thickness. A nanowire device 1504 has a thickness t less than a critical layer thickness tc (t<tc). Data 1505 show that manufacturing a III-V material based device channel layer on a III-V material based second buffer layer on a III-V material based first buffer layer, wherein the second buffer layer has a lattice parameter that matches the lattice parameter of the device channel layer, and wherein the first buffer layer has a lattice parameter between the lattice parameter of the substrate and the device layer (e.g., a trigate on a buffer device 1503, a nanowire on a buffer device 1504)(or equal to lattice parameter of the channel) increase the device performance.

As indicated above, integration of III-V materials on large scale Si substrates is difficult. This difficulty has been one of the key issues preventing use of III-V materials and transistors in high-performance logic. Buffer approaches have traditionally been proposed but they prevent use of multiple materials on the same chip. Instead, ART has been proposed to allow selective deposition of III-V materials in trenches. Still, these ART based methods have failed to isolate the channel and prevent fin current leakage.

However, as shown herein, various embodiments address the problem of device isolation in such ART trenches. Embodiments address these problems by extending band engineering and heterostructure into the ART trench space while addressing different lattice constants and materials relevant for logic implementation in fin architecture.

There are several conventional ways to address use of III-V materials on Si substrates. For example, a method uses a uniform channel material (e.g., InGaAs) to fill a trench. However, this is limited by critical layer values of the channel material and may also fail to prevent defects from existing in the channel. Another conventional method includes using a GaAs seed layer between the Si substrate and the III-V material channel. However, this may help isolate the channel material from the substrate but it fails to provide a good lattice constant matching to the channel (which can lead to defects in the channel). Another conventional method includes using an InP seed layer, which does not help isolation between the substrate and channel when the seed layer is undoped. Further, the InP seed layer is only lattice matched to a specific InGaAs channel composition and thus lacks versatility to prevent lattice mismatch and defects in the channel (which degrades device performance).

In contrast, as shown above, several embodiments provide flexibility for various processes and materials that can be combined to provide: (1) correct device isolation between the channel and substrate (e.g., to prevent leakage current from a fin), and (2) proper lattice constant matching for a variety of channel material compositions (e.g., to isolate defects from the channel). Also, since traditional ART trenches may not provide enough (vertical) dimension to reduce defects, the increased band offsets between buffer layers and the channel found in various embodiments provide additional device isolations (to limit power loss) compared to lattice matched defect free solutions commonly used.

More specifically, an embodiment utilizes a large band-gap (large band offset) between the channel and a buffer (located between the channel and the substrate). Further, the buffer may be a barrier lattice matched to a III-V transistor channel to improve device isolation and reduce sub-fin leakage. The materials that can be used for the buffer layers and channel are diverse and not limited to any one combination. The material selection is driven by band-gap and lattice matching considerations.

Regarding materials selection, various embodiments include channel materials having InAs and high In % InGaAs. These embodiments may couple these channels with buffers/barriers including materials such as InP and InAlAs. For example, embodiments may include several different bottom barriers depending on specific lattice constant matching to a channel of the device requirement.

Figure 17:
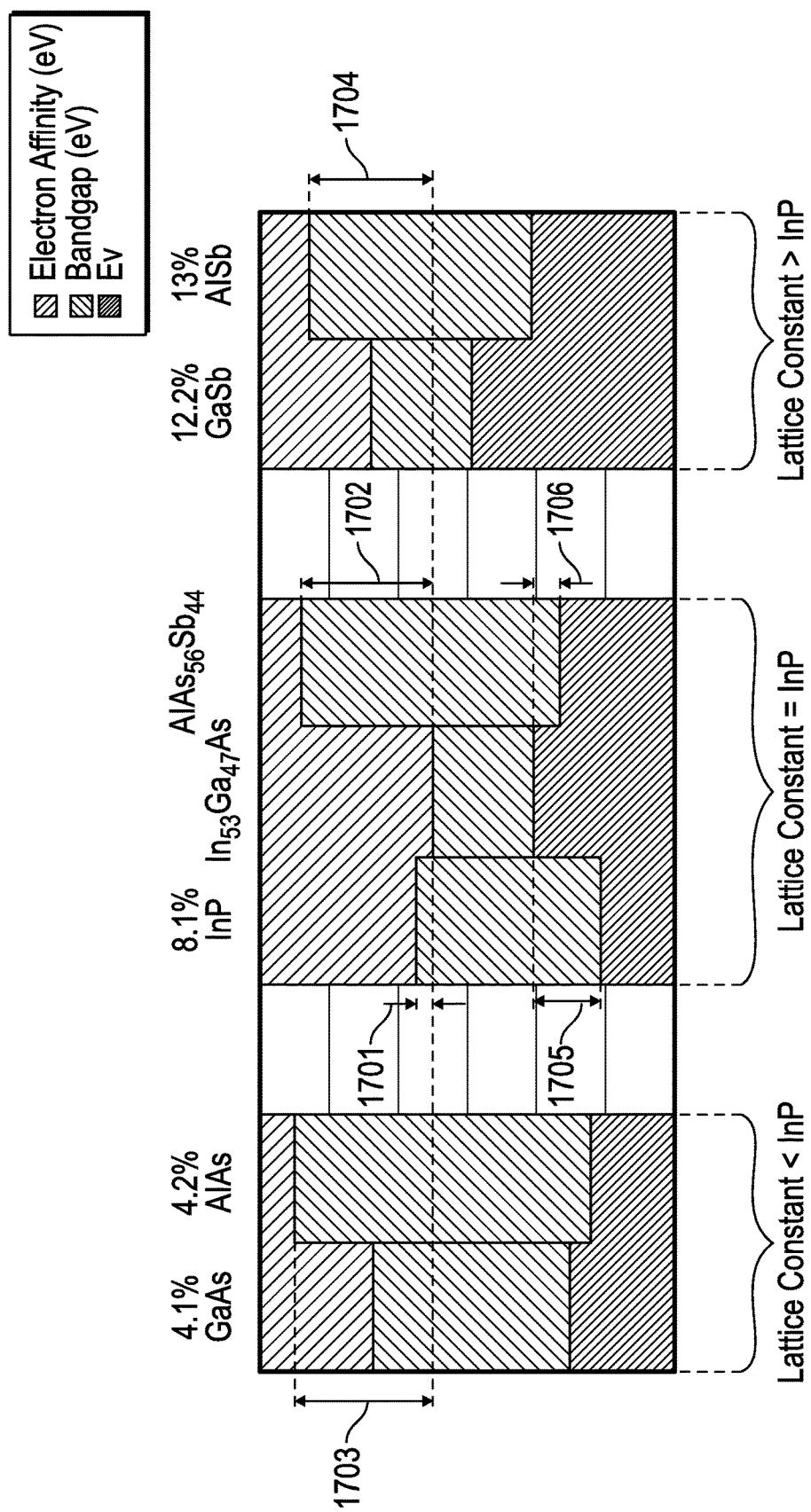
FIG. 17 includes band alignment and lattice constant information for materials used in embodiments of the invention.

FIG. 17 shows a series of materials. GaAs has a 4.1% lattice mismatch with a Si substrate and AlAs has a 4.2% lattice mismatch with a Si substrate. Both GaAs and AlAs have a lattice constant less than that of InP. InP, $In_{53}Ga_{47}As$, and $AlAs_{56}Sb_{44}$ all have an 8.1% lattice mismatch with a Si substrate. GaSb has a 12.2% lattice mismatch with a Si substrate and AlSb has a 13% lattice mismatch with a Si substrate, both of which are higher than the lattice mismatch of InP. AlAs has a large conductance band offset (CBO) 1703 with $In_{53}Ga_{47}As$ (which could be used as a channel) but also has a large lattice mismatch (8.1%–4.2%=3.9%) with $In_{53}Ga_{47}As$ and therefore may be a less than ideal buffer selection to directly contact the channel (because it may generate defects into the channel). The same is true for, as an example, AlSb which may have a large CBO 1704 with $In_{53}Ga_{47}As$ (which could be used as a channel) but also has a large lattice mismatch (13%–8.1%=4.9%) with $In_{53}Ga_{47}As$ and therefore may be a less than ideal buffer selection to directly contact the channel. To further illustrate the point, an embodiment may include an InGaAs channel with an InP bottom barrier. As shown in FIG. 17, both InP and $In_{53}Ga_{47}As$ have an 8.1% lattice mismatch as compared to a Si substrate. While InP and $In_{53}Ga_{47}As$ are lattice matched (which is good for lessening defect generation) this may not be ideal for device isolation due to low conduction band offset 1701 between InP and InGaAs.

As a result, an embodiment uses AsSb based materials, such as $AlAs_{56}Sb_{44}$, because AsSb based materials (a) are lattice matched to any InGaAs composition (including desired In-rich InGaAs compositions such as $In_{70}Ga_{30}As$) considering both have 8.1% lattice mismatch with a Si substrate. Further, AsSb based materials, such as $AlAs_{56}Sb_{44}$, (b) have a larger (better) CBO 1702 to InGaAs as compared to InP (offset 1701) or InAlAs. This may make for an ideal match (a proper balancing of lattice matching and CBO between buffer and channel) for an N carrier device wherein the Source (s) and Drain (d) are negatively doped. Thus, AsSb based materials, such as $AlAs_{56}Sb_{44}$, may be used for buffer 305 of FIG. 12 and $In_{70}Ga_{30}As$ may be used for channel 307.

While many potential combinations are within the scope of the invention, embodiments include channels 1802, 1802' having $In_{53}Ga_{47}As$ (FIG. 18*a*) and $In_{70}Ga_{30}As$ (FIG. 18*b*), located within a trench formed within insulation layer 1801, 1801'. The trench may have a portion that is triangular (see portion including sides 1806, 1807 and 1806', 1807'). Both of these examples start with a lower lattice matched GaAsSb compound buffer layer 1804, 1804' (i.e., lattice matched to the channel). The Al containing layer stops or limits Si from diffusing from the substrate into the channel layer. Both examples then switch growth to lattice matched AlAsSb buffers 1803 ($AlAs_{54}Sb_{46}$), 1803' ($AlAs_{42}Sb_{58}$) (i.e., lattice matched to $In_{53}Ga_{47}As$ and $In_{70}Ga_{30}As$ channels 1802, 1802'). The examples of FIGS. 18*a* and 18*b* maximize CBO between the upper buffer 1803, 1803' and the channels 1802, 1802' while matching lattice constants between buffers 1803, 1803' and 53% (FIG. 18*a*) and 70% (FIG. 18*b*) Indium in InGaAs channels 1802, 1802'. The Al based material buffers 1803, 1803' set the proper barrier to prevent sub-fin leakage from channels 1802, 1802'.

Figure 19:
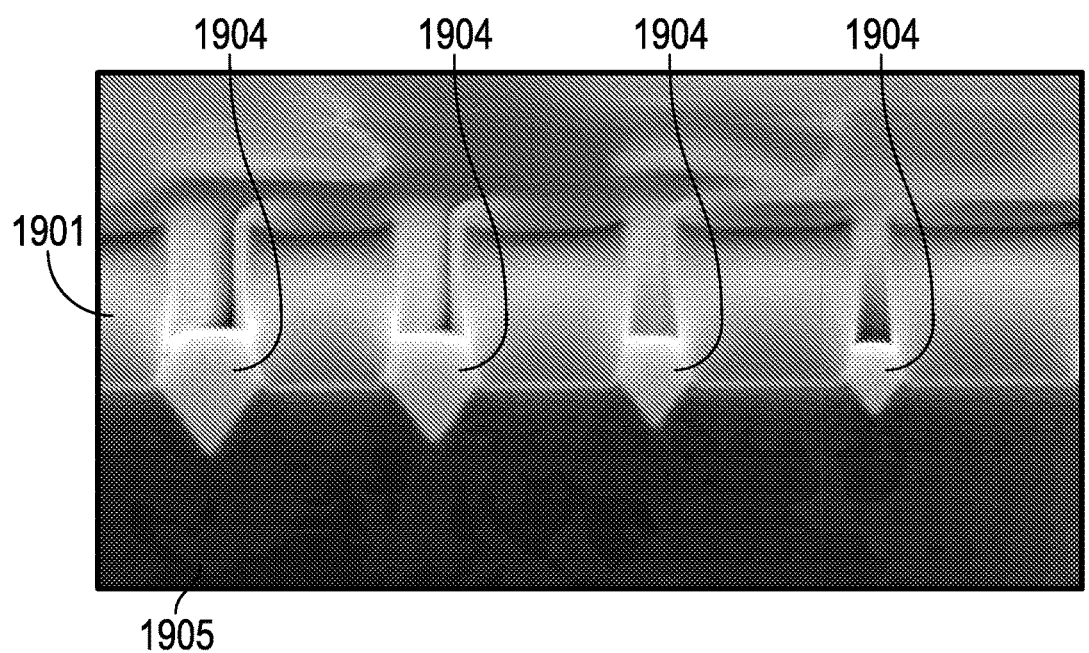
FIG. 19 includes an image of a portion of a III-V material device in an embodiment of the invention.

FIG. 19 shows a Sb containing compound (e.g., GaAsSb) 1904 in an ART trench, formed within an insulation layer 1901 and Si substrate 1905. This image shows the point in the manufacturing method after the lower buffer 1904 has been formed but before any upper buffer (e.g., AlAsSb) or channel (e.g., $In_{53}Ga_{47}As$ and $In_{70}Ga_{30}As$) has been formed.

Figure 18:
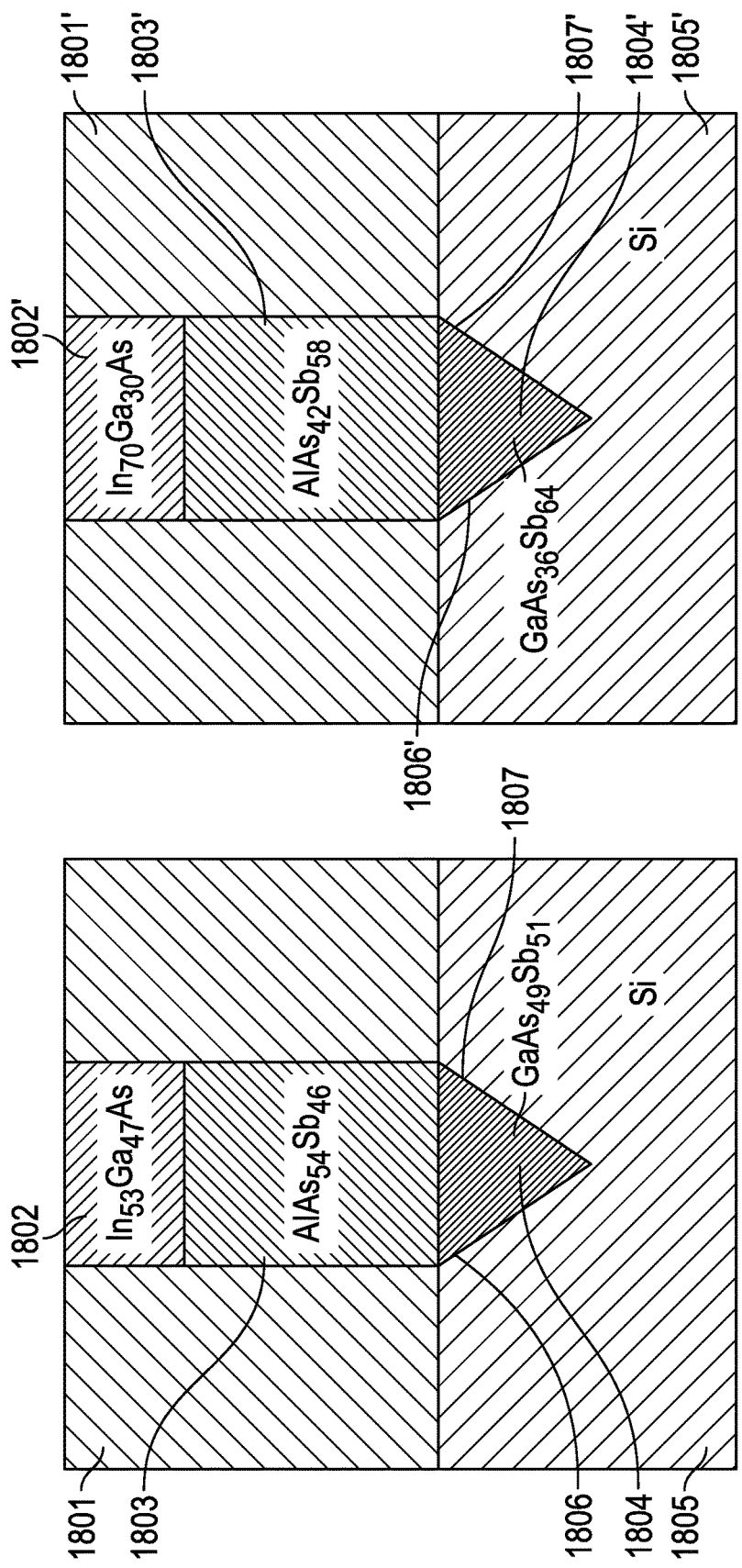
FIG. 18 includes cross-sectional views of III-V materials based devices in two embodiments of the invention.

Embodiments such as the embodiments of FIGS. 18a and 18b enable integration of novel III-V materials on Si substrates and allow scaling of devices to smaller dimensions (e.g., because the need for tall ART trenches is reduced) while maintaining performance (e.g., by controlling or limiting leakage current from the channel and fin).

Figure 16:
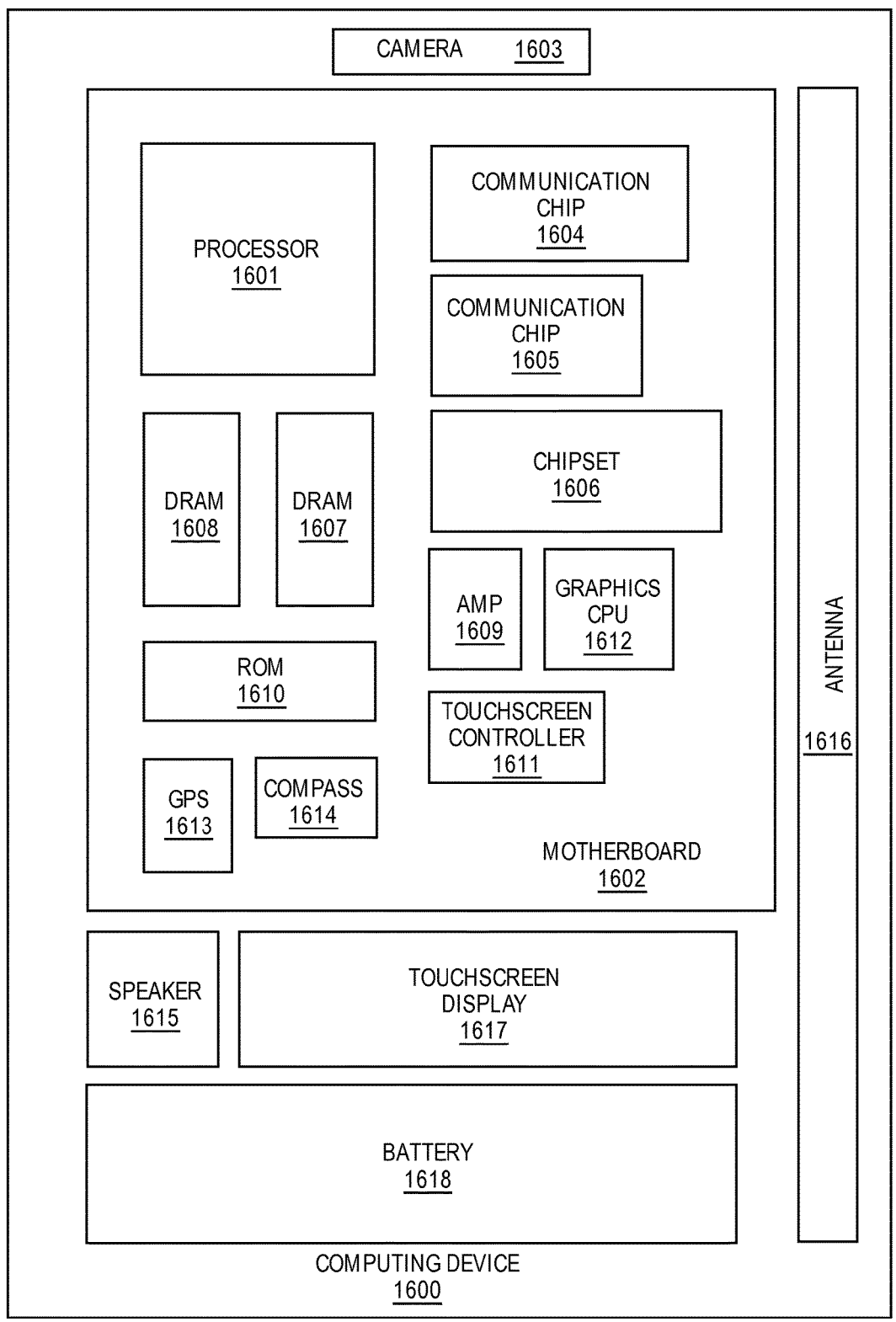
FIG. 16 illustrates a computing device 1600 in accordance with one embodiment.

FIG. 16 illustrates a computing device 1600 in accordance with one embodiment. The computing device 1600 houses a board 1602. The board 1602 may include a number of components, including but not limited to a processor 1601 and at least one communication chip 1604. The processor 1601 is physically and electrically coupled to the board 1602. In some implementations at least one communication chip is also physically and electrically coupled to the board 1602. In further implementations, at least one communication chip 1604 is part of the processor 1601.

Depending on its application, computing device 1600 may include other components that may or may not be physically and electrically coupled to the board 1602. These other components include, but are not limited to, a memory, such as a volatile memory 1608 (e.g., a DRAM), a non-volatile memory 1610 (e.g., ROM), a flash memory, a graphics processor 1612, a digital signal processor (not shown), a crypto processor (not shown), a chipset 1606, an antenna 1616, a display (e.g., a touchscreen display 1617), a display controller (e.g., a touchscreen controller 1611), a battery 1618, an audio codec (not shown), a video codec (not shown), an amplifier (e.g., a power amplifier 1609), a global positioning system (GPS) device 1613, a compass 1614, an accelerometer (not shown), a gyroscope (not shown), a speaker 1615, a camera 1603, and a mass storage device (such as hard disk drive, compact disk (CD), digital versatile disk (DVD), and so forth) (not shown).

A communication chip (e.g., communication chip 1604) enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1604 may implement any of a number of wireless standards or protocols, including but not limited to Wi-Fi (IEEE 802.11 family), WiMAX (IEEE 802.16 family), IEEE 802.20,long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips. For instance, a communication chip 1604 may be dedicated to shorter range wireless communications such as Wi-Fi and Bluetooth and a communication chip 1636 may be dedicated to longer range wireless communications such as GPS, EDGE, GPRS, CDMA, WiMAX, LTE, Ev-DO, and others.

In at least some embodiments, at least some of the components of the computing device 1600 (e.g., processor 1601, communication chip 1604, graphic CPU 1612) include a multilayer stack comprising a first III-V material based buffer layer in a trench in an insulating layer on a Si substrate, a second III-V material based buffer layer on the first III-V material based buffer layer; and a III-V material based device layer on the second buffer layer, wherein the second III-V material based buffer layer has a lattice parameter that matches the lattice parameter of the III-V material based device channel layer, and wherein the first III-V material based buffer layer has a lattice parameter between the lattice parameter of the Si substrate and the III-V material based device layer (or equal to the buffer contacting the device layer), as described herein.

An integrated circuit die of at least some components of the computing device 1600 (e.g., processor 1601, graphic CPU 1612) include one or more III-V materials based devices, such as tri-gate transistors, nanowires, and/or nanoribbons manufactured using methods as described herein. The term "processor" may refer to any device or portion of a device that processes electronic data from registers and/or memory to transform that electronic data into other electronic data that may be stored in registers and/or memory.

The communication chip 1604 also can include a multilayer stack comprising a first III-V material based buffer layer in a trench in an insulating layer on a Si substrate, a second III-V material based buffer layer on the first III-V material based buffer layer; and a III-V material based device layer on the second buffer layer, wherein the second III-V material based buffer layer has a lattice parameter that matches the lattice parameter of the III-V material based device channel layer, and wherein the first III-V material based buffer layer has a lattice parameter between the lattice parameter of the Si substrate and the III-V material based device layer (or equal to the device layer or buffer layer contacting the device layer), according to the embodiments described herein.

In various implementations, the computing device 1600 may be a laptop, a netbook, a notebook, an ultrabook, a smartphone, a tablet, a personal digital assistant (PDA), an ultra-mobile PC, a mobile phone, a wearable computing node (e.g., eyeglasses, wristwatch), a desktop computer, a server, a printer, a scanner, a monitor, a set-top box, an entertainment control unit, a digital camera, a portable music player, or a digital video recorder. In further implementations, the computing device 1600 may be any other electronic device that processes data.

Figure 20:
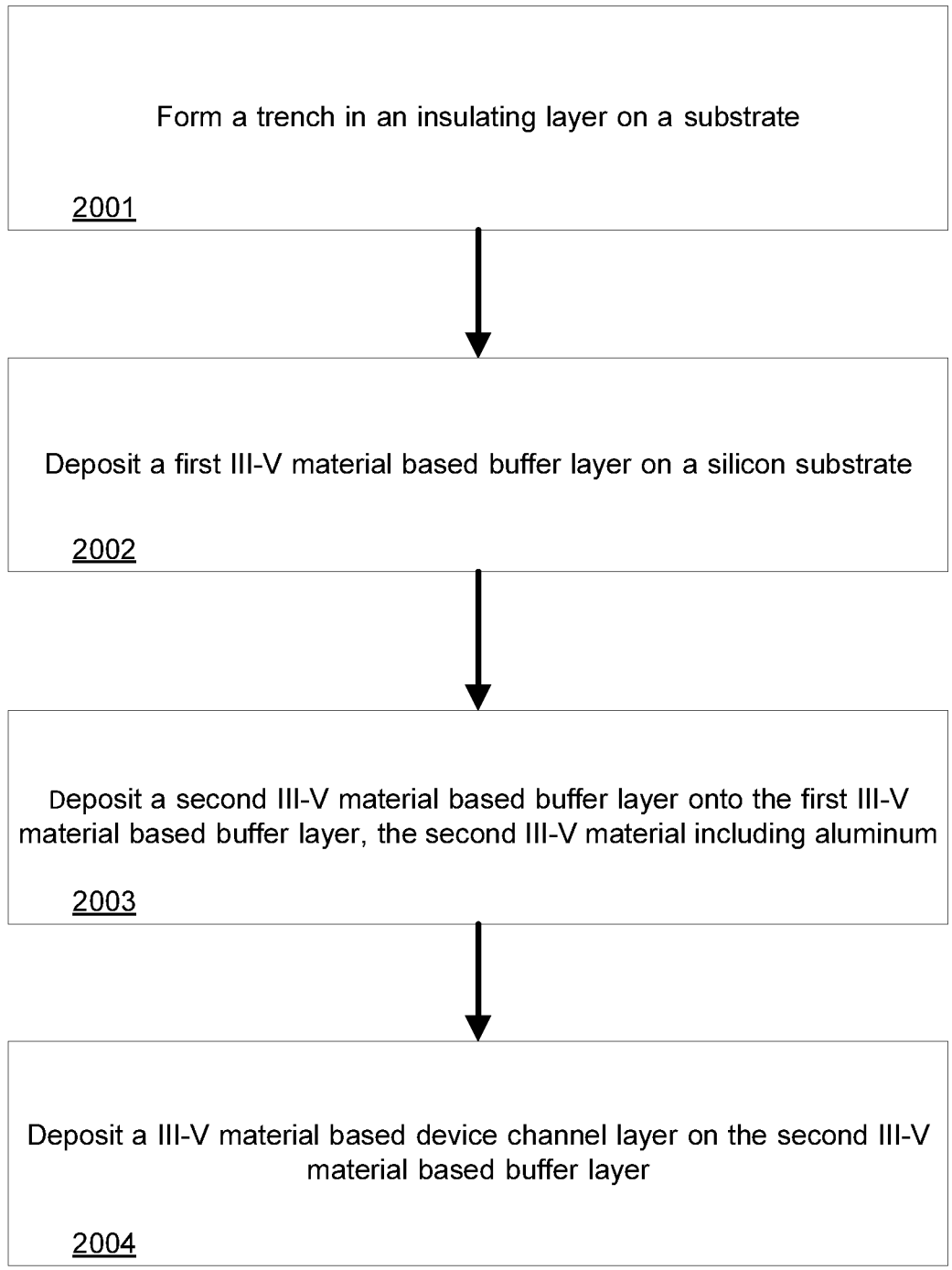
FIG. 20 includes a method of making a device in an embodiment of the invention.

FIG. 20 includes a method of making a device in an embodiment of the invention. The method includes block 2001 (Form a trench in an insulating layer on a substrate), Block 2002 (Deposit a first III-V material based buffer layer on the Si substrate), Block 2003 (Deposit a second III-V material based buffer layer onto the first III-V material based buffer layer, the second III-V material including aluminum), and Block 2004 (Deposit a III-V material based device channel layer on the second III-V material based buffer layer).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a III-V material based device, comprising: a first III-V material based buffer layer on a Si substrate; a second III-V material based buffer layer on the first III-V material based buffer layer, the second III-V material including aluminum; and a III-V material based device channel layer on the second III-V material based buffer layer. For example, the first buffer layer may be layer 104 of FIG. 10, the second buffer layer may be layer 105, and the channel may be layer 111. By having a "first III-V material based buffer layer" the buffer layer includes materials from groups III and V of the periodic table. In an embodiment a minimum CBO of 0.3 eV exists between the channel layer (e.g., layer 111) and the buffer layer directly beneath it (e.g., layer 105), with the buffer layer being of sufficient thickness to set up a band gap. However, other embodiments may have a CBO of 0.4, 0.5, 0.6, 0.7 eV or more. In an embodiment the first and second buffer layers are undoped In an embodiment with two buffer layers under the channel the upper buffer layer may be doped (but not necessarily the bottom buffer layer, although the bottom buffer layer may be doped in some embodiments). An embodiment includes a CBO of 0.3 eV (between the channel layer and buffer layer immediately below the channel layer) and a P-doped upper buffer layer directly under the channel. Embodiments reduce the amount of doping needed by increasing the CBO (or reduce the CBO by increasing the doping). Some embodiments reduce the doping of the upper buffer layer to zero by having a large CBO. In an embodiment a "Si substrate" may include Si, SiGe (and various compositions thereof) or other compositions that include Si.

While many embodiments described herein include two buffer layers other embodiments are not so limited and may include 1, 3, 4, 5, 6, 7, 8 or more buffer layers below the channel layer. For example, a single doped layer of GaAsSb serves as the only buffer layer in some embodiments. Other embodiments may have more than two layers at various steps in the manufacturing of the device (e.g., including high and low temperature steps such as steps related to low temperature GaAs, high temperature GaAs, low temperature InP, high temperature InP, high temperature InAlAs, high temperature InGaAs).

In example 2 the subject matter of the Example 1 can optionally include wherein the second III-V material based buffer layer has a lattice parameter that matches the lattice parameter of the III-V material based device channel layer. In another version of example 2 the subject matter of the Example 1 can optionally include wherein the second III-V material based buffer layer has a lattice parameter that generally matches the lattice parameter of the III-V material based device channel layer. By "generally match" or "match" the match need not be 100% perfect and may deviate a slight amount as to be understood by those of ordinary skill in the art (e.g., lattice constants must be close enough to each other so no substantive defects (as seen using typical resolution imaging by those of ordinary skill in the art) are created during the deposition of the channel layer). Also, while saying the lattice parameters "match" the materials used to create this match may or may not be the same. For example, the second buffer layer and the channel layer may have equal lattice parameters but may include differing materials such as AlAsSb and InGaAs.

In example 3 the subject matter of the Examples 1-2 can optionally include wherein the III-V material based device channel layer includes InGaAs. For example, the InGaAs may include $In_xGa_{1-x}As$, $In_{53}Ga_{47}As$, $In_{70}Ga_{39}As$, and the like. Other embodiments are not so limited and may include, for example, InAs but not Ga. The InAs may be included with other materials, other than Ga, in the channel layer. Embodiments with InGaAs channel layers may include various In compositions including In compositions in the 50-80% range (e.g., 50, 55, 60, 65, 70, 75, 80%).

In example 4 the subject matter of the Examples 1-3 can optionally include wherein the first III-V material based buffer layer has a lattice parameter equal to the III-V material based device channel layer. For example, the first buffer layer may include InP, the second buffer layer may include some form of AlAsSb, and the channel may include some form of InGaAs. The InP and InGaAs may be lattice matched.

In example 5 the subject matter of the Examples 1-4 can optionally include wherein the first III-V material based buffer layer has a lattice parameter between the lattice parameter of the Si substrate and the III-V material based device channel layer.

In example 6 the subject matter of the Examples 1-5 can optionally include wherein the first III-V material based buffer layer has a lattice parameter equal to the III-V material based device channel layer.

In example 7 the subject matter of the Examples 1-6 can optionally include wherein at least a portion of the first III-V material based buffer layer has a triangular cross-sectional profile. For example, the 1806, 1807 elements in FIGS. 18a and 18b define two parts of the triangular profile. Further, any of the embodiments of FIGS. 1-12 may include a triangular cross-sectional profile similar to the triangular cross-sectional profile shown in FIGS. 18a and 18b In example 8 the subject matter of the Examples 1-7 can optionally include wherein the second III-V material based buffer layer includes AlAsSb. For example, the second buffer layer may include AlAsSb, $AlAs_{54}Sb_{46}$, $AlAs_{42}Sb_{58}$, $AlAs_xSb_{1-x}$.

In example 9 the subject matter of the Examples 1-8 can optionally include wherein a cap layer is deposited on the III-V material based device channel layer.

In example 10 the subject matter of the Examples 1-9 can optionally include wherein the first and second III-V materials and the III-V material based device channel layer are all included in a trench having an aspect ratio (depth to width) of at least 2:1, the trench being formed in an insulating layer. Other ratios are included in other embodiments including 3:1, 4:1, 5:1, 6:1 and the like.

In example 11 the subject matter of the Examples 1-10 can optionally include wherein a fin is formed from the III-V material based device channel layer and at least one of the first and second III-V material based buffer layers. For example, FIG. 10 shows a fin formed from at least one of the first and second buffer layers.

In example 13 the subject matter of the Examples 1-12 can optionally include wherein concentration of indium in the III-V material based device channel layer is at least 53%.

In another version of example 13 the subject matter of the Examples 1-12 can optionally include wherein the first III-V material based buffer layer includes AsSb and a third material and the second III-V material based buffer layer includes AsSb and a fourth material that is unequal tot the third material. For example, Al may be used in the second buffer. For example, Ga may be used in the first buffer. For example, Al may be used in the second buffer and Ga may be used in the first buffer. The use of AsSb (and another material) in either or both of the first and second buffer layers provides for CBO with the channel layer as well as lattice matching with the channel layer. For example, either of the buffer layers may include $In_xGa_{1-x}AsSb$. Another embodiment may include InP or $In_{53}Ga_{47}As$ in the channel layer, $GaAs_{49}Sb_{51}$ in the first buffer layer, and AlAsSb in the second buffer layer. An embodiment may include InP or $In_{53}Ga_{47}As$ in the channel layer, $GaAs_{49}Sb_{51}$ in the second buffer layer, and AsSb and another element in the first buffer layer. An embodiment may include $In_{70}Ga_{30}As$ in the channel layer with $GaAs_{36}Sb_{64}$ in the first buffer layer and AlAsSb in the second buffer layer. An embodiment may include $In_{70}Ga_{30}As$ in the channel layer with $GaAs_{36}Sb_{64}$ in the second buffer layer and AsSb and another element in the first buffer layer. Other embodiments include AlGaAsSb in one of the buffer layers and AsSb and another element in another of the buffer layers.

Example 14 includes a III-V material based device, comprising: a first III-V material based buffer layer on a Si substrate; a second III-V material based buffer layer on the first III-V material based buffer layer, the second III-V material including AlAsSb; and a III-V material based device channel layer on the second III-V material based buffer layer, the III-V material based device channel layer including InGaAs. However, in some embodiments the upper buffer layer does not necessarily require or include Al. For example, an embodiment may include a 0.3 eV CBO between the channel layer and the upper buffer layer (although other embodiments may include 0.4, 0.5., 6, 0.7, 0.8 eV CBO or more between the channel and upper buffer layers). In such a scenario Al may not be needed to provide desired isolation to the channel layer.

In example 15 the subject matter of the Example 14 can optionally include wherein the second III-V material based buffer layer has a lattice parameter that matches the lattice parameter of the III-V material based device channel layer and directly contacts the III-V material based device channel layer.

In example 16 the subject matter of the Examples 14-15 can optionally include wherein the first III-V material based buffer layer includes Ga and directly contacts the second III-V material based buffer layer.

In example 17 the subject matter of the Examples 14-16 can optionally include wherein the second III-V material based buffer layer includes $AlAs_xSb_{1-x}$.

In example 18 the subject matter of the Examples 14-17 can optionally include wherein the first and second III-V materials are included in a trench having an aspect ratio (depth to width) of at least 2:1.

Example 19 includes a semiconductor processing method comprising A method to manufacture a III-V material based device, comprising: depositing a first III-V material based buffer layer on a Si substrate; depositing a second III-V material based buffer layer onto the first III-V material based buffer layer, the second III-V material including aluminum; and depositing a III-V material based device channel layer on the second III-V material based buffer layer.

In example 20 the subject matter of the Example 19 can optionally include, wherein the second III-V material based buffer layer has a lattice parameter that matches the lattice parameter of the III-V material based device channel layer.

In example 21 the subject matter of the Examples 19-20 can optionally include forming a trench in an insulating layer on the substrate, and including the first and second III-V material based buffer layers in the trench.

In example 22 the subject matter of the Examples 19-21 can optionally include wherein the second III-V material based buffer layer includes AsSb, the first II-V material based buffer layer includes Ga, and the III-V material based device channel layer includes InGaAs. Thus, not all embodiments require Al in the second buffer layer or InGaAs in the channel layer.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A III-V material based device, comprising:
   a first III-V material based buffer layer on a silicon substrate;
   a second III-V material based buffer layer on the first III-V material based buffer layer, the second III-V material including aluminum;
   a III-V material based device channel layer on the second III-V material based buffer layer; and
   a fin that comprises the III-V material based device channel layer and at least one of the first and second III-V material based buffer layers.

2. The III-V material based device of claim 1, wherein the second III-V material based buffer layer has a lattice parameter that matches the lattice parameter of the III-V material based device channel layer.

3. The III-V material based device of claim 2, wherein the III-V material based device channel layer includes InGaAs.

4. The III-V material based device of claim 3, wherein the first III-V material based buffer layer has a lattice parameter equal to the III-V material based device channel layer.

5. The III-V material based device of claim 2, wherein the first III-V material based buffer layer has a lattice parameter between the lattice parameter of the silicon substrate and the III-V material based device channel layer.

6. The III-V material based device of claim 2, wherein the first III-V material based buffer layer has a lattice parameter equal to the III-V material based device channel layer.

7. The III-V material based device of claim 2, wherein at least a portion of the first III-V material based buffer layer has a triangular cross-sectional profile.

8. The III-V material based device of claim 2, wherein the second III-V material based buffer layer includes AlAsSb.

9. The III-V material based device of claim 2, wherein a cap layer is deposited on the III-V material based device channel layer.

10. The III-V material based device of claim 2, wherein the first and second III-V material based buffer layers and the III-V material based device channel layer are all included in a trench having an aspect ratio (depth to width) of at least 2:1, the trench being formed in an insulating layer.

11. The III-V material based device of claim 2, further comprising a negatively doped III-V material based source adjacent a channel that is included in the III-V material based channel device layer.

12. The III-V material based device of claim 2, wherein a concentration of indium in the III-V material based device channel layer is at least 53%.

13. The III-V material based device of claim 1, wherein the first III-V material based buffer layer includes AsSb and a third material and the second III-V material based buffer layer includes AsSb and a fourth material that is unequal to the third material.

14. A III-V material based device, comprising:
   a first III-V material based buffer layer on a silicon substrate;
   a second III-V material based buffer layer on the first III-V material based buffer layer, the second III-V material including AlAsSb; and
   a III-V material based device channel layer on the second III-V material based buffer layer, the III-V material based device channel layer including InGaAs;
   wherein the first III-V material based buffer layer includes GaAsSb and directly contacts the second III-V material based buffer layer.

15. The device of claim 14, wherein the second III-V material based buffer layer has a lattice parameter that matches the lattice parameter of the III-V material based device channel layer and directly contacts the III-V material based device channel layer.

16. The device of claim 15, wherein the second III-V material based buffer layer includes $AlAs_xSb_{1-x}$.

17. The device of claim 16, wherein the first and second III-V material based buffer layers are included in a trench having an aspect ratio (depth to width) of at least 2:1.

18. A method to manufacture a III-V material based device, comprising:
   forming a trench in an insulating layer on a silicon substrate;
   depositing a first III-V material based buffer layer on the silicon substrate and in the trench;
   depositing a second III-V material based buffer layer onto the first III-V material based buffer layer and in the trench, the second III-V material including aluminum; and
   depositing a III-V material based device channel layer on the second III-V material based buffer layer.

19. The method of claim 18, wherein the second III-V material based buffer layer has a lattice parameter that matches the lattice parameter of the III-V material based device channel layer.

20. The method of claim 19, wherein the second III-V material based buffer layer includes AsSb, the first III-V material based buffer layer includes Ga, and the III-V material based device channel layer includes In.

21. A III-V material based device, comprising:
   a first III-V material based buffer layer on a silicon substrate;
   a second III-V material based buffer layer on the first III-V material based buffer layer, the second III-V material including aluminum; and
   a III-V material based device channel layer on the second III-V material based buffer layer;
   wherein the first and second III-V material based buffer layers and the III-V material based device channel layer are all included in a trench.

22. The device of claim 21 wherein the trench has an aspect ratio (depth to width) of at least 2:1 and is included in an insulating layer.

23. The device of claim 21 wherein a concentration of indium in the III-V material based device channel layer is at least 53%.

* * * * *